United States Patent
Akutsu et al.

(10) Patent No.: US 11,046,869 B2
(45) Date of Patent: Jun. 29, 2021

(54) POLISHING LIQUID, POLISHING LIQUID SET, AND SUBSTRATE POLISHING METHOD

(71) Applicant: HITACHI CHEMICAL COMPANY, LTD., Tokyo (JP)

(72) Inventors: Toshiaki Akutsu, Tokyo (JP); Hisataka Minami, Tokyo (JP); Tomohiro Iwano, Tokyo (JP); Tetsuro Yamashita, Tokyo (JP); Masako Aoki, Tokyo (JP); Masato Fukasawa, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/758,399

(22) PCT Filed: Jun. 13, 2016

(86) PCT No.: PCT/JP2016/067585
§ 371 (c)(1),
(2) Date: Mar. 8, 2018

(87) PCT Pub. No.: WO2017/043139
PCT Pub. Date: Mar. 16, 2017

(65) Prior Publication Data
US 2018/0258319 A1    Sep. 13, 2018

(30) Foreign Application Priority Data
Sep. 9, 2015    (JP) .............................. JP2015-177529

(51) Int. Cl.
*C09G 1/02* (2006.01)
*C09K 3/14* (2006.01)
(Continued)

(52) U.S. Cl.
CPC ................. *C09G 1/02* (2013.01); *B24B 1/00* (2013.01); *B24B 37/044* (2013.01); *C09G 1/00* (2013.01);
(Continued)

(58) Field of Classification Search
None
See application file for complete search history.

(56) References Cited

U.S. PATENT DOCUMENTS

2004/0258608 A1*  12/2004  Cayton ............... B01F 17/0028
                                                          423/592.1
2009/0075093 A1*  3/2009  Iversen ............... C11D 11/0035
                                                          428/432
(Continued)

FOREIGN PATENT DOCUMENTS

CN    101033374 A    9/2007
CN    101326256 A    12/2008
(Continued)

*Primary Examiner* — Jiong-Ping Lu
(74) *Attorney, Agent, or Firm* — Fitch, Even, Tabin & Flannery, L.L.P.

(57) ABSTRACT

A polishing liquid comprising a liquid medium, an abrasive grain and a polymer, wherein the polymer includes a first molecular chain having a functional group directly bonded thereto, and a second molecular chain branched from the first molecular chain, and the functional group is at least one selected from the group consisting of a carboxyl group, a carboxylic acid salt group, a hydroxyl group, a sulfo group and a sulfonic acid salt group.

22 Claims, 2 Drawing Sheets

(51) Int. Cl.
  *C09K 13/06* (2006.01)
  *C09G 1/04* (2006.01)
  *C09G 1/00* (2006.01)
  *C09G 1/06* (2006.01)
  *B24B 1/00* (2006.01)
  *H01L 21/321* (2006.01)
  *H01L 21/306* (2006.01)
  *B24B 37/04* (2012.01)
  *H01L 21/3105* (2006.01)
  *H01L 21/304* (2006.01)

(52) U.S. Cl.
  CPC ............ *C09G 1/04* (2013.01); *C09G 1/06* (2013.01); *C09K 3/1454* (2013.01); *C09K 3/1463* (2013.01); *C09K 13/06* (2013.01); *H01L 21/304* (2013.01); *H01L 21/30625* (2013.01); *H01L 21/31053* (2013.01); *H01L 21/3212* (2013.01)

(56) References Cited

U.S. PATENT DOCUMENTS

| | | | | |
|---|---|---|---|---|
| 2010/0081281 | A1* | 4/2010 | Babu | C09G 1/02 438/693 |
| 2010/0107509 | A1* | 5/2010 | Guiselin | B24D 3/00 51/298 |
| 2011/0059680 | A1* | 3/2011 | Motonari | C09G 1/02 451/36 |
| 2012/0322346 | A1* | 12/2012 | Iwano | B24B 37/044 451/36 |
| 2015/0017806 | A1* | 1/2015 | Akutsu | C09K 3/1409 438/693 |

FOREIGN PATENT DOCUMENTS

| | | |
|---|---|---|
| CN | 101946309 A | 1/2011 |
| CN | 102146235 A | 8/2011 |
| CN | 102648265 A | 8/2012 |
| JP | 2006-249129 A | 9/2006 |
| JP | 2009-518852 A | 5/2009 |
| JP | 2013-507786 A | 3/2013 |
| TW | 201038690 A1 | 11/2010 |
| WO | 02/067309 A1 | 8/2002 |
| WO | 2009/104334 A1 | 8/2009 |
| WO | 2012/070541 A1 | 5/2012 |
| WO | 2012/070544 A1 | 5/2012 |
| WO | 2012/070542 A1 | 5/2014 |
| WO | 2015/008193 A1 | 1/2015 |

* cited by examiner

U.S. 11,046,869 B2

POLISHING LIQUID, POLISHING LIQUID SET, AND SUBSTRATE POLISHING METHOD

CROSS-REFERENCE TO RELATED APPLICATIONS

This application is a U.S. national phase application filed under 35 U.S.C. § 371 of International Application No. PCT/JP2016/067585, filed Jun. 13, 2016, which claims priority from Japanese Patent Application No. 2015-177529, filed Sep. 9, 2015, designating the United States, which are hereby incorporated herein by reference in their entirety.

TECHNICAL FIELD

The present invention relates to a polishing liquid, a polishing liquid set and a polishing method for a base substrate. In particular, the present invention relates to a polishing liquid, a polishing liquid set and a polishing method for a base substrate, which can be used in a flattening step of a base substrate surface as a production technique for a semiconductor element. More specifically, the present invention relates to a polishing liquid, a polishing liquid set and a polishing method for a base substrate, which can be used in a flattening step for a Shallow Trench Isolation (hereunder, "STI".) insulating material, a pre-metal insulating material, an interlayer insulating material or the like.

BACKGROUND ART

In recent years, processing techniques for increasing density and micronization are becoming ever more important in manufacturing steps for semiconductor elements. One such machining technique, CMP (chemical mechanical polishing) technique, has become an essential technique in manufacturing steps for semiconductor elements, for STI formation, flattening of pre-metal insulating materials or interlayer insulating materials, and formation of plugs or embedded metal wirings, and the like.

Polishing liquids commonly comprise abrasive grains. It is known that silica (silicon oxide) particles such as fumed silica and colloidal silica, alumina (aluminum oxide) particles, or ceria (cerium oxide) particles are used as abrasive grains.

Recently, as demand increases for achieving greater micronization of wirings in manufacturing steps for semiconductor elements, generation of polishing scratches during polishing are becoming problematic. A solution to this problem is being sought through studying polishing liquids that employ particles of hydroxides of a tetravalent metal element (see Patent Literatures 1 to 3 below, for example). Methods for producing particles of hydroxides of a tetravalent metal element are also being studied (see Patent Literatures 4 and 5 below, for example). Such techniques are aimed at reducing particle-induced polishing scratches, by maintaining the chemical action of particles of the hydroxide of a tetravalent metal element while minimizing their mechanical action.

CITATION LIST

Patent Literature

Patent Literature 1: International Patent Publication No. WO2002/067309
Patent Literature 2: International Patent Publication No. WO2012/070541
Patent Literature 3: International Patent Publication No. WO2012/070542
Patent Literature 4: Japanese Unexamined Patent Application Publication No. 2006-249129
Patent Literature 5: International Patent Publication No. WO2012/070544

Non-Patent Literature

Non-Patent Literature 1: Complete Works of Dispersion Technology, Johokiko Co., Ltd., July, 2005, Chapter 3, "Dispersers: Recent development trends and selection criteria"

SUMMARY OF INVENTION

Technical Problem

In CMP steps or the like for formation of STIs, it is common to provide a stopper (for example, a stopper film. Also referred to as "polishing stop layer".) on a convexity of a substrate having a concavity and convexity pattern. Specifically, a laminated body including a substrate having a concavity and convexity pattern, a stopper disposed on a convexity of the substrate, and an insulating material disposed on the substrate and the stopper so as to fill a concavity therewith is polished to thereby remove an unnecessary portion of the insulating material. The reason for this is because it is difficult to control the amount of the insulating material to be polished (the amount of the insulating material to be removed), and the degree of polishing is controlled by polishing the insulating material until the stopper is exposed. In this case, if polishing of the stopper can be inhibited as much as possible, polishing can be stopped when polishing progresses and the stopper is exposed, to thereby prevent excessive polishing of the stopper, and/or the insulating material embedded in the concavity.

On the contrary, if polishing of the stopper is not adequately inhibited, polishing is difficult to stop when the stopper is exposed, to thereby cause excessive progression of polishing. As a result, the difference in the thickness of a device isolation insulating material (an insulating material with which the concavity is filled), and/or in the thickness of the stopper may occur to thereby produce defective products. Accordingly, the ability to control polishing of the stopper is preferably as high as possible in CMP steps or the like for formation of STIs, and there is demanded a polishing liquid that can enhance the ability to lower the polishing rate for a stopper material. Silicon nitride or polysilicon is commonly used as a stopper material in CMP steps or the like for formation of STIs.

A conventional polishing liquid that uses a particle of a hydroxide of a tetravalent metal element has the advantages of having a favorable polishing rate with respect to an insulating material and also being able to inhibit the generation of polishing scratches. On the other hand, it is relatively difficult to lower the polishing rate for a stopper material. For example, a polishing liquid that uses a particle of a hydroxide of a tetravalent metal element has the tendency that the polishing rate for an insulating material to be removed is increased by increasing the pH, but the polishing rate for a stopper material may also be simultaneously increased.

It is an object of the present invention to solve this technical problem and provide a polishing liquid that can polish an insulating material at a high polishing rate and that can also adequately lower the polishing rate for a stopper material. Another object of the present invention is to provide a polishing liquid set for obtaining the polishing liquid. Still another object of the present invention is to provide a polishing method for a base substrate using the polishing liquid or the polishing liquid set.

Solution to Problem

The present inventors have found that the above problem can be solved by a polishing liquid comprising an abrasive grain and a polymer, in which a polymer including a first molecular chain having a specified functional group directly bonded thereto, and a second molecular chain branched from the first molecular chain is used.

The polishing liquid of the invention comprises a liquid medium, an abrasive grain and a polymer, wherein the polymer includes a first molecular chain having a functional group directly bonded thereto, and a second molecular chain branched from the first molecular chain, and the functional group is at least one selected from the group consisting of a carboxyl group, a carboxylic acid salt group, a hydroxyl group, a sulfo group and a sulfonic acid salt group.

The polishing liquid of the invention can polish an insulating material at a high polishing rate and can also adequately lower the polishing rate for a stopper material. Such a polishing liquid can improve the polishing selectivity for insulating material with respect to stopper material (polishing rate for insulating material/polishing rate for stopper material). In addition, the polishing liquid of the invention can also be applied in CMP techniques for flattening of STI insulating materials, pre-metal insulating materials, interlayer insulating materials and the like, for a high degree of flattening of these insulating materials. The polishing liquid of the invention can polish an insulating material with few polishing scratches, while achieving a high degree of flattening of insulating materials.

In a conventional polishing liquid where a silica particle, a ceria particle, or the like is used as an abrasive grain, an anionic polymer (polycarboxylic acid, polysulfonic acid, or the like) is widely used in order to lower the polishing rate for a stopper material while increasing the polishing rate for insulating materials. However, when such an anionic polymer is used for a polishing liquid where a particle of a hydroxide of a tetravalent metal element is used, there are cases where the effect of inhibiting the generation of polishing scratches and the effect of improving the polishing rate for insulating materials cannot be obtained because of aggregation of particles. On the other hand, the polishing liquid of the invention can polish an insulating material at a high polishing rate and can also adequately lower the polishing rate for a stopper material while aggregation of the abrasive grain is inhibited (dispersion stability is kept).

The first molecular chain preferably comprises at least one selected from the group consisting of a structural unit derived from styrene, a structural unit derived from olefin, a structural unit derived from acrylic acid, a structural unit derived from methacrylic acid, a structural unit derived from maleic acid and a structural unit derived from vinyl acetate. This allows an insulating material to be easily polished at a high polishing rate and also allows the polishing rate for a stopper material to be easily adequately lowered.

The first molecular chain preferably comprises at least one selected from the group consisting of a polyester chain, a polyurethane chain and a polyamide chain. This allows an insulating material to be easily polished at a high polishing rate and also allows the polishing rate for a stopper material to be easily adequately lowered.

The second molecular chain preferably comprises at least one selected from the group consisting of a hydrophilic molecular chain and a hydrophobic molecular chain. This allows an insulating material to be easily polished at a high polishing rate and also allows the polishing rate for a stopper material to be easily adequately lowered, while inhibiting aggregation of the abrasive grain.

The second molecular chain preferably comprises at least one selected from the group consisting of a polyether chain, a polyvinyl alcohol chain and a polyvinylpyrrolidone chain. This allows an insulating material to be easily polished at a high polishing rate and also allows the polishing rate for a stopper material to be easily adequately lowered, while inhibiting aggregation of the abrasive grain.

The second molecular chain preferably comprises at least one selected from the group consisting of a structural unit derived from styrene, a structural unit derived from olefin, a structural unit derived from acrylic acid, a structural unit derived from methacrylic acid, a structural unit derived from maleic acid, a structural unit derived from vinyl acetate, a polyester chain, a polyurethane chain and a polyamide chain. This allows an insulating material to be easily polished at a high polishing rate and also allows the polishing rate for a stopper material to be easily adequately lowered, while inhibiting aggregation of the abrasive grain.

The abrasive grain preferably comprises at least one selected from the group consisting of ceria, silica, alumina, zirconia, and hydroxides of a tetravalent metal element, more preferably comprises a hydroxide of a tetravalent metal element. This allows an insulating material to be polished at a higher polishing rate.

The hydroxide of a tetravalent metal element is preferably at least one selected from the group consisting of hydroxide of rare earth metal element and hydroxide of zirconium. This allows an insulating material to be polished at a higher polishing rate and also allows the generation of polishing scratches at a polished surface to be further inhibited.

The content of the polymer is preferably 0.001 mass % or greater and 0.5 mass % or less based on the total mass of the polishing liquid. This allows an insulating material to be easily polished at a high polishing rate and also allows the polishing rate for a stopper material to be easily inhibited, while inhibiting aggregation of the abrasive grain. In addition, the generation of polishing scratches at a polished surface can be further inhibited.

One aspect of the invention relates to use of the polishing liquid in polishing of a surface to be polished containing silicon oxide. That is, the polishing liquid of the invention is preferably used for polishing of a surface to be polished containing silicon oxide.

The polishing liquid set of the invention comprises constituent components of the polishing liquid, separately stored as a first liquid and a second liquid, wherein the first liquid comprises the abrasive grain and a liquid medium, and the second liquid comprises the polymer and a liquid medium. The polishing liquid set of the invention can achieve the same effect as that of the polishing liquid of the invention.

A polishing method for a base substrate of one aspect of the invention may comprise a step of polishing a surface to be polished of a base substrate using the polishing liquid, and may comprise a step of polishing a surface to be polished of a base substrate using a polishing liquid obtained by mixing the first liquid and the second liquid of the polishing liquid set. According to these polishing methods, by using the polishing liquid or the polishing liquid set, it is possible to achieve the same effect as that of the polishing liquid of the invention.

A polishing method for a base substrate of another aspect of the invention is a polishing method for a base substrate having an insulating material and silicon nitride, and the method may comprise a step of selectively polishing the insulating material with respect to the silicon nitride using the polishing liquid, and may comprise a step of selectively polishing the insulating material with respect to the silicon nitride using a polishing liquid obtained by mixing the first liquid and the second liquid of the polishing liquid set. According to these polishing methods, by the polishing liquid or the polishing liquid set, it is possible to achieve the same effect as that of the polishing liquid of the invention in the case where the insulating material is selectively polished with respect to the silicon nitride.

A polishing method for a base substrate of another aspect of the invention is a polishing method for a base substrate having an insulating material and polysilicon, and the method may comprise a step of selectively polishing the insulating material with respect to the polysilicon using the polishing liquid, and may comprise a step of selectively polishing the insulating material with respect to the polysilicon using a polishing liquid obtained by mixing the first liquid and the second liquid of the polishing liquid set. According to these polishing methods, by using the polishing liquid or the polishing liquid set, it is possible to achieve the same effect as that of the polishing liquid of the invention in the case where the insulating material is selectively polished with respect to the polysilicon.

Advantageous Effects of Invention

According to the invention, it is possible to provide a polishing liquid that can polish an insulating material (for example, silicon oxide) at a high polishing rate and that can also adequately lower the polishing rate for a stopper material (for example, silicon nitride and polysilicon). According to the invention, it is also possible to provide a polishing liquid set for obtaining the polishing liquid. Furthermore, according to the invention, it is possible to provide a polishing method for a base substrate using the polishing liquid or the polishing liquid set. According to the invention, it is possible to improve the polishing selectivity for insulating material with respect to stopper material.

According to the invention, it is possible to adequately stop polishing on a stopper even if either silicon nitride or polysilicon is used as a stopper material. In particular, when silicon nitride is used as a stopper material, an insulating material can be polished at a high polishing rate and also the polishing rate for the silicon nitride can be adequately lowered. According to such invention, in polishing of an insulating material by use of silicon nitride as a stopper material, it is possible to inhibit excessive polishing of a stopper, and an insulating material embedded in a concavity, when the stopper is exposed.

Furthermore, according to the invention, in CMP techniques for flattening STI insulating materials, pre-metal insulating materials, interlayer insulating materials and the like, it is also possible to achieve a high degree of flattening of these insulating materials. In addition, according to the invention, it is also possible to polish insulating materials with few polishing scratches, while achieving a high degree of flattening of insulating materials.

According to the invention, it is possible to provide use of a polishing liquid or a polishing liquid set in a flattening step of a base substrate surface. According to the invention, it is possible to provide use of a polishing liquid or a polishing liquid set in a flattening step of STI insulating materials, pre-metal insulating materials or interlayer insulating materials. According to the invention, it is possible to provide use of a polishing liquid or a polishing liquid set in a polishing step of selectively polishing an insulating material with respect to a stopper material.

DESCRIPTION OF EMBODIMENTS

Figure 1:
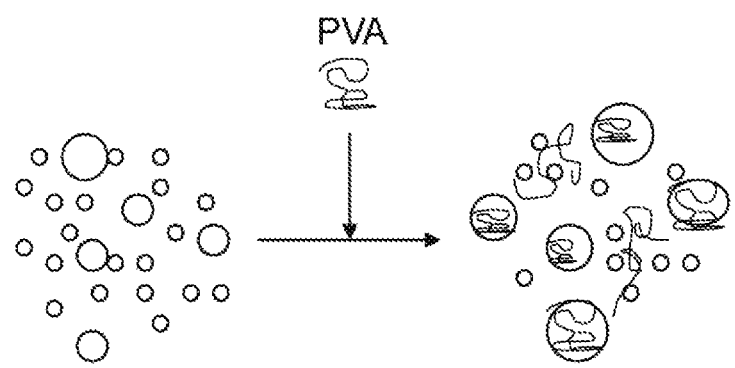
FIG. 1 is a schematic diagram showing the aggregated condition of abrasive grains when an additive has been added.

The polishing liquid, the polishing liquid set and the polishing method for a base substrate using the same, according to an embodiment of the invention, will now be explained in detail.

<Definition>

Throughout the present specification, the "polishing liquid" (polishing liquid, abrasive) is defined as a composition to be brought into contact with a surface to be polished during polishing. The term "polishing liquid" by itself does not limit any component contained in the polishing liquid at all. As described hereunder, the polishing liquid of the embodiment comprises an abrasive grain (abrasive grain). The abrasive grain is also referred to as "abrasive particle" (abrasive particle), but is referred to as "abrasive grain" throughout the present specification. An abrasive grain is commonly a solid particle, and it is considered that a subject to be removed is removed (removed) by the mechanical action of the abrasive grain and the chemical action of the abrasive grain (mainly the surface of the abrasive grain) during polishing, but is not limited thereto.

<Polishing Liquid>

The polishing liquid of the embodiment is, for example, a polishing liquid for CMP. Specifically, the polishing liquid of the embodiment comprises a liquid medium, an abrasive grain, and a branched polymer including a first molecular chain having a functional group directly bonded thereto, and a second molecular chain branched from the first molecular chain, and the functional group is at least one selected from the group consisting of a carboxyl group, a carboxylic acid salt group, a hydroxyl group, a sulfo group and a sulfonic acid salt group.

The essential components, and components which can be optionally added will now be explained.

(Abrasive Grain)

The abrasive grain preferably comprises at least one selected from the group consisting of ceria, silica, alumina, zirconia, and hydroxides of a tetravalent metal element, more preferably comprises a hydroxide of a tetravalent metal element. Throughout the present specification, the term "hydroxide of a tetravalent metal element" refers to a compound containing a tetravalent metal ($M^{4+}$) and at least one hydroxide ion ($OH^-$). The hydroxide of a tetravalent metal element may contain an anion other than a hydroxide ion (for example, a nitrate ion $NO_3^-$ and sulfate ion $SO_4^{2-}$). For example, the hydroxide of a tetravalent metal element may contain an anion (for example, a nitrate ion $NO_3^-$ and sulfate ion $SO_4^{2-}$) bonded to a tetravalent metal element.

Abrasive grains containing a hydroxide of a tetravalent metal element have high reactivity with insulating materials (such as silicon oxide) compared to abrasive grains composed of silica, ceria or the like, and are able to polish insulating materials at higher polishing rates. The abrasive grain used may be a single type or a combination of two or more types. An example of other abrasive grains other than abrasive grains containing a hydroxide of a tetravalent metal element includes particles containing silica, alumina, ceria or the like. Also, composite particles containing a hydroxide of a tetravalent metal element and silica may be used as the abrasive grains containing a hydroxide of a tetravalent metal element.

The hydroxide of a tetravalent metal element is preferably at least one selected from the group consisting of hydroxide of rare earth metal element and hydroxide of zirconium. The hydroxide of a tetravalent metal element is more preferably a hydroxide of a rare earth metal element from the viewpoint of further improving the polishing rate for insulating materials. Rare earth metal elements that can adopt tetravalent forms include lanthanoids such as cerium, praseodymium and terbium, among them, lanthanoids are preferred, and cerium is more preferred from the viewpoint of a further excellent polishing rate for insulating materials. A hydroxide of rare earth metal element and hydroxide of zirconium may be used in combination, or two or more may be selected for use from among hydroxides of rare earth metal element.

When the abrasive grain comprises a hydroxide of a tetravalent metal element, the lower limit for the content of the hydroxide of a tetravalent metal element is preferably 80 mass % or greater, more preferably 90 mass % or greater, even more preferably 95 mass % or greater, especially preferably 98 mass % or greater, extremely preferably 99 mass % or greater based on the total abrasive grain (the total abrasive grain comprised in the polishing liquid). From the viewpoint of further excellent polishing properties as well as easier preparation of the polishing liquid, it is most preferred for the abrasive grain to be composed of a hydroxide of a tetravalent metal element (i.e. 100 mass % of the abrasive grain is substantially a particle of the hydroxide of a tetravalent metal element).

The lower limit for the mean particle diameter of the abrasive grain in the polishing liquid or the slurry of the polishing liquid set described hereunder is preferably 1 nm or greater, more preferably 2 nm or greater, even more preferably 3 nm or greater, especially preferably 5 nm or greater, extremely preferably 10 nm or greater, from the viewpoint of further improving the polishing rate for insulating materials. The upper limit for the mean particle diameter of the abrasive grain is preferably 300 nm or less, more preferably 250 nm or less, even more preferably 200 nm or less, especially preferably 100 nm or less, extremely preferably 50 nm or less, very preferably 30 nm or less, from the viewpoint of further minimizing scratches at the polished surface. From the viewpoints, the mean particle diameter of the abrasive grains is more preferably 1 nm or greater and 300 nm or less.

The "mean particle diameter" of the abrasive grain is the mean secondary particle diameter of the abrasive grain. For example, the mean particle diameter of the abrasive grain can be measured for the polishing liquid or the slurry of the polishing liquid set described hereunder, using an optical diffraction scattering particle size distribution meter (for example, trade name: N5 by Beckman Coulter, Inc. or trade name: Zetasizer 3000HSA by Malvern Instruments, Inc.).

In the constituent components of the polishing liquid of the embodiment, the hydroxide of a tetravalent metal element is considered to have a major effect on the polishing properties. Thus, adjusting the content of the hydroxide of a tetravalent metal element can improve chemical interaction between the abrasive grains and the surface to be polished, and further improve the polishing rate. Therefore, the lower limit for the content of the hydroxide of a tetravalent metal element is preferably 0.01 mass % or greater, more preferably 0.02 mass % or greater, even more preferably 0.03 mass % or greater, especially preferably 0.05 mass % or greater based on the total mass of the polishing liquid. In addition, from the viewpoint of easily avoiding aggregation of the abrasive grain while obtaining satisfactory chemical interaction with the surface to be polished and effectively making use of the abrasive grain properties, the upper limit for the content of the hydroxide of a tetravalent metal element is preferably 8 mass % or less, more preferably 5 mass % or less, even more preferably 3 mass % or less, especially preferably 1 mass % or less, extremely preferably 0.5 mass % or less, very preferably 0.3 mass % or less, still more preferably 0.1 mass % or less based on the total mass of the polishing liquid.

The lower limit for the content of the abrasive grain is preferably 0.005 mass % or greater, more preferably 0.01 mass % or greater, even more preferably 0.02 mass % or greater, especially preferably 0.03 mass % or greater, extremely preferably 0.04 mass % or greater, very preferably 0.05 mass % or greater based on the total mass of the polishing liquid, from the viewpoint of further improving the polishing rate for insulating materials. From the viewpoint of increasing the storage stability of the polishing liquid, the upper limit for the content of the abrasive grain is preferably 20 mass % or less, more preferably 15 mass % or less and even more preferably 10 mass % or less, based on the total mass of the polishing liquid. From the viewpoints, the content of the abrasive grain is more preferably 0.005 mass % or greater and 20 mass % or less based on the total mass of the polishing liquid.

The content of the abrasive grain is preferably further reduced to allow further reduction in cost and polishing scratches. Generally, a low content of the abrasive grain will tend to lower the polishing rate for insulating materials and the like. On the other hand, the abrasive grains containing a hydroxide of a tetravalent metal element allow a prescribed polishing rate to be obtained even when used in small amounts, and therefore the content of the abrasive grain can be further reduced while maintaining balance between the polishing rate and the advantages of reducing the content of the abrasive grain. From such a viewpoint, the upper limit for the content of the abrasive grain is preferably 8 mass % or less, more preferably 5 mass % or less, even more preferably 3 mass % or less, especially preferably 1 mass % or less, extremely preferably 0.5 mass % or less, very preferably 0.3 mass % or less, still more preferably 0.1 mass % or less based on the total mass of the polishing liquid.

[Absorbance]

The abrasive grains preferably comprise a hydroxide of a tetravalent metal element and also satisfy at least one of the conditions (a) and (b) below. An "aqueous dispersion" having a content of the abrasive grain adjusted to a prescribed content is a liquid containing a prescribed content of abrasive grains and water.

(a) The abrasive grains produce absorbance of 1.00 or greater for light with a wavelength of 400 nm in an aqueous dispersion having the content of the abrasive grain adjusted to 1.0 mass %.

(b) The abrasive grains produce absorbance of 1.000 or greater for light with a wavelength of 290 nm in an aqueous dispersion having the content of the abrasive grain adjusted to 0.0065 mass %.

With regard to the condition (a), the polishing rate can be further improved by using abrasive grains that produce absorbance of 1.00 or greater for light with a wavelength of 400 nm in an aqueous dispersion having the content of the abrasive grain adjusted to 1.0 mass %. The reason for this is not fully understood, but the present inventors conjecture as follows. Specifically, it is considered that particles, containing $M(OH)_aX_b$ composed of a tetravalent metal ($M^{4+}$), 1 to 3 hydroxide ions ($OH^-$) and 1 to 3 anions ($X^{c-}$) (wherein a+b×c=4), are produced as part of the abrasive grains, depending on the production conditions for the hydroxide of a tetravalent metal element (such particles are also "abrasive grains containing a hydroxide of a tetravalent metal element"). It is considered that, in $M(OH)_aX_b$, the electron-withdrawing anion ($X^{c-}$) acts to improve the hydroxide ion reactivity, thus the polishing rate is improved as the abundance of $M(OH)_aX_b$ increases. Also, it is considered that, since the particles containing $M(OH)_aX_b$ absorb light with a wavelength of 400 nm, the polishing rate is improved as an abundance of $M(OH)_aX_b$ is increased to increase absorbance for light with a wavelength of 400 nm.

It is considered that abrasive grains containing a hydroxide of a tetravalent metal element contain not only $M(OH)_aX_b$ but also $M(OH)_4$, $MO_2$ or the like. The anion ($X^{c-}$) may be $NO_3^-$ and $SO_4^{2-}$, for example.

It is possible to confirm that the abrasive grain containing a hydroxide of a tetravalent metal element includes $M(OH)_aX_b$ by the method of detecting the peak corresponding to the anion ($X^{c-}$) with FT-IR ATR method (Fourier transform Infra Red Spectrometer Attenuated Total Reflection method) after thoroughly washing the abrasive grain with purified water. The presence of the anion ($X^{c-}$) can be also confirmed by XPS method (X-ray Photoelectron Spectroscopy method).

The absorption peak of $M(OH)_aX_b$ (for example, $M(OH)_3X$) at a wavelength of 400 nm has been confirmed to be much lower than the absorption peak at a wavelength of 290 nm described below. In this regard, as a result of studying degrees of absorbance using aqueous dispersions with relatively high content of the abrasive grain of 1.0 mass %, which allow absorbance to be easily detected as high absorbance, the present inventors have found that the effect of improving polishing rate is superior when using abrasive grains that produce absorbance of 1.00 or greater for light with a wavelength of 400 nm in the aqueous dispersion. Incidentally, since it is considered that the absorbance for light with a wavelength of 400 nm derives from the abrasive grains, as explained above, it is difficult to obtain the effect of improving polishing rate with a polishing liquid containing a substance (such as a pigment component exhibiting a yellow color) that produces absorbance of 1.00 or greater for light with a wavelength of 400 nm, instead of abrasive grains that produce absorbance of 1.00 or greater for light with a wavelength of 400 nm.

The lower limit for the absorbance for light with a wavelength of 400 nm is preferably 1.50 or greater, more preferably 1.55 or greater, even more preferably 1.60 or greater from the viewpoint of easily allowing polishing of insulating materials at a further superior polishing rate.

With regard to the condition (b), the polishing rate can be further improved by using abrasive grains that produce absorbance of 1.000 or greater for light with a wavelength of 290 nm in an aqueous dispersion having the content of the abrasive grain adjusted to 0.0065 mass %. The reason for this is not fully understood, but the present inventors conjecture as follows. Specifically, particles containing $M(OH)_aX_b$ (for example, $M(OH)_3X$) that are produced depending on the production conditions for the hydroxide of a tetravalent metal element have a calculated absorption peak around a wavelength of 290 nm, and for example, particles composed of $Ce^{4+}(OH^-)_3NO_3^-$ have an absorption peak at a wavelength of 290 nm. Consequently, it is considered that the polishing rate is improved in accordance with the increase in absorbance for light with a wavelength of 290 nm due to the increase in the abundance of $M(OH)_aX_b$.

The absorbance for light around a wavelength of 290 nm tends to be detected to a greater degree as the measuring limit is exceeded. In this regard, as a result of studying degrees of absorbance using aqueous dispersions with relatively low content of the abrasive grain of 0.0065 mass %, which allow absorbance to be easily detected as low absorbance, the present inventors have found that the effect of improving polishing rate is superior when using abrasive grains that produce absorbance of 1.000 or greater for light with a wavelength of 290 nm in the aqueous dispersion. The present inventors have also found that, apart from light around a wavelength of 400 nm, which tends to cause an absorbing substance to exhibit a yellow color when it is absorbed by the absorbing substance, higher absorbance for light around a wavelength of 290 nm of abrasive grains produces deeper yellowishness in a polishing liquid and slurry employing such abrasive grains, and found that the polishing rate is improved as yellowishness of the polishing liquid and slurry becomes deeper. Also, the present inventors found that the absorbance for light with a wavelength of 290 nm in an aqueous dispersion with a content of the abrasive grain of 0.0065 mass % and the absorbance for light with a wavelength of 400 nm in an aqueous dispersion with a content of the abrasive grain of 1.0 mass % are correlated.

The lower limit for the absorbance of light with a wavelength of 290 nm is more preferably 1.050 or greater, even more preferably 1.100 or greater, especially preferably 1.130 or greater and extremely preferably 1.150 or greater, from the viewpoint of allowing polishing of insulating materials at a further superior polishing rate. The upper limit for the absorbance for light with a wavelength of 290 nm is not particularly restricted, but is preferably 10.00, for example.

If abrasive grains, which produce absorbance of 1.00 or greater for light with a wavelength of 400 nm, produce absorbance of 1.000 or greater for light with a wavelength of 290 nm in an aqueous dispersion having the content of the abrasive grain adjusted to 0.0065 mass %, it is possible to polish the insulating materials at a further excellent polishing rate.

In addition, the hydroxide of a tetravalent metal element (for example, $M(OH)_aX_b$) tends not to absorb light with wavelengths of 450 nm or greater (especially, wavelengths of 450 to 600 nm). Therefore, from the viewpoint of minimizing adverse effects on polishing by the presence of impurities to polish insulating materials at further excellent polishing rates, the abrasive grains preferably produce absorbance of 0.010 or less for light with a wavelength of 450 to 600 nm in an aqueous dispersion having the content of the abrasive grain adjusted to 0.0065 mass % (65 ppm). Specifically, the absorbance preferably does not exceed 0.010 for all light within a wavelength range of 450 to 600 nm in an aqueous dispersion having the content of the abrasive grain adjusted to 0.0065 mass %. The upper limit for the absorbance for light with a wavelength of 450 to 600 nm is more preferably less than 0.010. The lower limit for the absorbance for light with a wavelength of 450 to 600 nm is preferably 0.

The absorbance in an aqueous dispersion can be measured, for example, using a spectrophotometer (apparatus name: U3310) by Hitachi, Ltd. Specifically, an aqueous dispersion having the content of the abrasive grain adjusted to 1.0 mass % or 0.0065 mass % is prepared as a measuring sample. Approximately 4 mL of this measuring sample is placed in a 1 cm-square cell, and the cell is set in the apparatus. Spectrophotometry is then conducted in a wavelength range of 200 to 600 nm, and the absorbance is judged from the obtained chart.

Screening of the absorbance may be accomplished by assuming that if absorbance of 1.00 or greater is exhibited when the absorbance for light with a wavelength of 400 nm is measured with excessive dilution so that the content of the abrasive grain is lower than 1.0 mass %, the absorbance will also be 1.00 or greater when the content of the abrasive grain is 1.0 mass %. Screening of the absorbance may be accomplished by assuming that if absorbance of 1.000 or greater is exhibited when the absorbance for light with a wavelength of 290 nm is measured with excessive dilution so that the content of the abrasive grain is lower than 0.0065 mass %, the absorbance will also be 1.000 or greater when the content of the abrasive grain is 0.0065 mass %. Screening of the absorbance may be accomplished by assuming that if absorbance of 0.010 or less is exhibited when the absorbance for light with a wavelength of 450 to 600 nm is measured with dilution so that the content of the abrasive grain is greater than 0.0065 mass %, the absorbance will also be 0.010 or less when the content of the abrasive grain is 0.0065 mass %.

[Light Transmittance]

The polishing liquid of the embodiment preferably has high transparency for visible light (it is visually transparent or nearly transparent). Specifically, the abrasive grains comprised in the polishing liquid of the embodiment preferably produce light transmittance of 50%/cm or greater for light with a wavelength of 500 nm in an aqueous dispersion having the content of the abrasive grain adjusted to 1.0 mass %. This can further inhibit reduction in polishing rate due to addition of additives, thus making it easier to obtain other properties while maintaining polishing rate. From this viewpoint, the lower limit for the light transmittance is more preferably 60%/cm or greater, even more preferably 70%/cm or greater, especially preferably 80%/cm or greater, extremely preferably 90%/cm or greater and very preferably 92%/cm or greater. The upper limit for the light transmittance is 100%/cm.

Although the reason for which reduction in polishing rate can be inhibited by adjusting the light transmittance of the abrasive grains is not thoroughly understood, the present inventors conjecture as follows. With abrasive grains containing a hydroxide of a tetravalent metal element (such as cerium), chemical effects are considered to be predominant over mechanical effects. Therefore, the number of abrasive grains is considered to contribute to the polishing rate more than the sizes of the abrasive grains.

It is considered that, in the case of low light transmittance in an aqueous dispersion having a content of the abrasive grain of 1.0 mass %, the abrasive grains present in the aqueous dispersion have relatively more particles with large particle diameters (hereunder referred to as "coarse particles"). When an additive (such as polyvinyl alcohol (PVA)) is added to a polishing liquid containing such abrasive grains, other particles aggregate around the coarse particles as nuclei, as shown in FIG. 1. As a result, it is considered that the number of abrasive grains acting on the surface to be polished per unit area (the effective abrasive grain number) is reduced, thus the specific surface area of the abrasive grains contacting with the surface to be polished is reduced, whereby reduction in polishing rate occurs.

Figure 2:
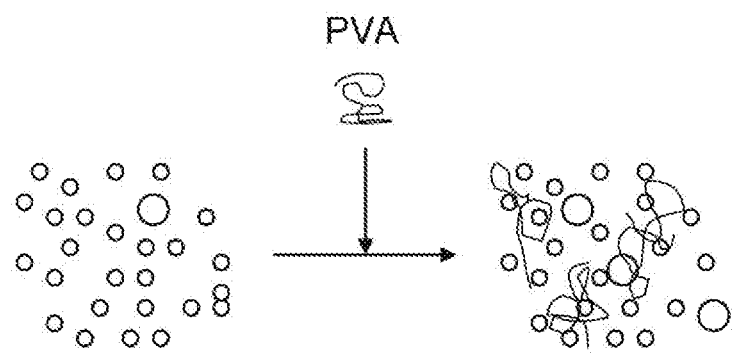
FIG. 2 is a schematic diagram showing the aggregated condition of abrasive grains when an additive has been added.

Conversely, it is considered that, in the case of high light transmittance in an aqueous dispersion having a content of the abrasive grain of 1.0 mass %, the abrasive grains present in the aqueous dispersion presumably have fewer "coarse particles". In such cases with a low abundance of coarse particles, as shown in FIG. 2, few coarse particles are available as nuclei for aggregation, and therefore aggregation between abrasive grains is inhibited or the sizes of the aggregated particles are smaller than the aggregated particles shown in FIG. 1, even when an additive (such as polyvinyl alcohol) is added to the polishing liquid. As a result, it is considered that the number of abrasive grains acting on the surface to be polished per unit area (the effective abrasive grain number) is maintained, thus the specific surface area of the abrasive grains contacting with the surface to be polished is maintained, whereby reduction in the polishing rate hardly occur.

According to research by the present inventors, it has been found that even among polishing liquids having identical particle diameters to each other as measured with a common particle diameter measuring apparatus, some may be visually transparent (high light transmittance) and some may be visually turbid (low light transmittance). It is considered that this suggests that coarse particles, which can produce the effect described above, can contribute to reduction in the polishing rate even in slight amounts that cannot be detected with common particle diameter measuring apparatuses.

It has also been found that even repeated filtration to reduce the amount of coarse particles does not significantly improve the phenomenon of reduced polishing rate with addition of additives, and there are cases where the effect of improving polishing rate due to absorbance is not adequately exhibited. The present inventors found that this problem can be overcome by using abrasive grains with high light transmittance in aqueous dispersion, for example, by modifying the method for producing the abrasive grains.

The light transmittance is the transmittance for light with a wavelength of 500 nm. The light transmittance can be measured using a spectrophotometer. Specifically, it can be measured with an U3310 Spectrophotometer (apparatus name) by Hitachi, Ltd., for example.

As a more specific measuring method, an aqueous dispersion having the content of the abrasive grain adjusted to 1.0 mass % is prepared as a measuring sample. Approximately 4 mL of this measuring sample is placed in a 1 cm-square cell, the cell is set in the apparatus, and then measurement is conducted. It is clear that, if the light transmittance is 50%/cm or greater in an aqueous dispersion having a content of the abrasive grain of greater than 1.0 mass %, the light transmittance will also be 50%/cm or greater when it is diluted to 1.0 mass %. Therefore, using an aqueous dispersion having a content of the abrasive grain of greater than 1.0 mass % allows screening of the light transmittance as a simple method.

The absorbance and light transmittance produced in the aqueous dispersion by abrasive grains comprised in the polishing liquid can be measured by preparing an aqueous dispersion having a prescribed content of the abrasive grain after removing the solid components other than the abrasive grains and the liquid components other than water, and using the aqueous dispersion for measurement. Depending on the components in the polishing liquid, the solid components and liquid components can be removed, for example, using a centrifugal separation method such as centrifugal separation using a centrifuge capable of applying gravitational acceleration of up to several thousand G or ultracentrifugation using an ultracentrifuge capable of applying gravitational acceleration of several tens of thousands G or more; a chromatographic method such as partition chromatography, adsorption chromatography, gel permeation chromatography or ion-exchange chromatography; a filtration method such as natural filtration, filtration under reduced pressure, pressure filtration or ultrafiltration; a distillation method such as vacuum distillation or atmospheric distillation, or a combination of the foregoing.

For example, when it contains a compound with a weight-average molecular weight of several tens of thousands or greater (for example, 50000 or greater), a chromatographic method, a filtration method or the like is exemplified, and, among them, at least one selected from the group consisting of gel permeation chromatography and ultrafiltration is preferred. When a filtration method is used, the abrasive grains comprised in the polishing liquid can pass through the filter by appropriately setting the conditions. When it contains a compound with a weight-average molecular weight of up to several tens of thousands (for example, less than 50000), a chromatographic method, filtration method, distillation method or the like is exemplified, and at least one selected from the group consisting of gel permeation chromatography, ultrafiltration and vacuum distillation is preferred. When a plural types of abrasive grains are contained, a filtration method, centrifugal separation method or the like is exemplified, and more abrasive grains containing the hydroxide of a tetravalent metal element will be present in the filtrate in the case of filtration or in the liquid phase in the case of centrifugal separation.

With regard to the method of separating abrasive grains by a chromatographic method, for example, the abrasive grain component can be separated and/or the other components can be separated, under the following conditions.

Sample solution: Polishing liquid 100 µL
Detector: UV-VIS Detector by Hitachi, Ltd., trade name: "L-4200"
Wavelength: 400 nm
Integrator: GPC integrator by Hitachi, Ltd., trade name: "D-2500"
Pump: Trade name: "L-7100" by Hitachi, Ltd.
Column: Aqueous HPLC packed column, trade name: "GL-W550S" by Hitachi Chemical Co., Ltd.
Eluent: Deionized water
Measuring temperature: 23° C.
Flow rate: 1 mL/min (pressure: approximately 40-50 kg/cm$^2$)
Measuring time: 60 minutes Before chromatography, eluent deaerating treatment is preferably carried out using a deaeration apparatus. When a deaeration apparatus cannot be used, the eluent is preferably subjected to deaerating treatment beforehand with ultrasonic waves or the like.

Although it may not be possible to separate the abrasive grain component under the above-mentioned conditions depending on the components comprised in the polishing liquid, in such cases, separation can be accomplished by optimizing the sample solution amount, the column type, the eluent type, the measuring temperature, the flow rate or the like. Also, by adjusting the pH of the polishing liquid to adjust the elution time of the components comprised in the polishing liquid, it may be possible to separate the abrasive grains. When the polishing liquid contains insoluble components, the insoluble components are preferably removed as necessary by filtration, centrifugal separation or the like.

[Method for Producing Abrasive Grains]

The hydroxide of a tetravalent metal element can be produced by reacting a tetravalent metal element salt (metal salt) with an alkaline source (base). The hydroxide of a tetravalent metal element is preferably produced by mixing a tetravalent metal element salt with an alkali solution (for example, an aqueous alkali solution). This will allow particles with extremely fine particle diameters to be obtained, so that the polishing liquid with a further excellent effect of reducing polishing scratches can be obtained. This method is disclosed in Patent Literature 4, for example. The hydroxide of a tetravalent metal element can be obtained by mixing a metal salt solution of a tetravalent metal element salt (for example, an aqueous metal salt solution) with an alkali solution. When either or both the tetravalent metal element salt and alkaline source is to be supplied to the reaction system in a liquid state, there is no limitation to the means for mixing the liquid mixture. For example, there may be mentioned a method of stirring the liquid mixture using a rod, plate or propeller-shaped stirrer or a stirring blade rotating around a rotating shaft, a method of stirring the liquid mixture by rotating a stirrer in a rotating magnetic field using a magnetic stirrer that transmits mechanical power from outside of the container, a method of stirring the liquid mixture with a pump installed outside of the tank, and a method of stirring the liquid mixture by blowing in pressurized external air with force into the tank. The tetravalent metal element salt used may be a known one without any particular restrictions, and an example includes $M(NO_3)_4$, $M(SO_4)_2$, $M(NH_4)_2(NO_3)_6$, $M(NH_4)_4(SO_4)_4$ (where M represents a rare earth metal element) and $Zr(SO_4)_2 \cdot 4H_2O$. M is preferably cerium (Ce) which is chemically active.

The means for adjusting the absorbance or light transmittance may be optimization of the method for producing the hydroxide of a tetravalent metal element. The method of varying the absorbance for light with a wavelength of 400 nm or the absorbance for light with a wavelength of 290 nm may be, specifically, selecting the alkaline source in the alkali solution, adjusting the raw material concentration of the metal salt solution and the alkali solution, adjusting the mixing rate of the metal salt solution and the alkali solution, or adjusting the liquid temperature of the liquid mixture obtained by mixing the tetravalent metal element salt and alkaline source. Also, the method of varying the light transmittance for light with a wavelength of 500 nm may be, specifically, adjusting the raw material concentration of the metal salt solution and the alkali solution, adjusting the mixing rate of the metal salt solution and the alkali solution, adjusting the stirring speed for mixing, or adjusting the liquid temperature of the liquid mixture.

In order to increase the absorbance for light with a wavelength of 400 nm, the absorbance for light with a wavelength of 290 nm and light transmittance for light with a wavelength of 500 nm, the method for producing the hydroxide of a tetravalent metal element is preferably performed more "moderately". Here, "moderately" means a moderate (slow) pH increase when the pH of the reaction system increases as the reaction proceeds. Conversely, in order to decrease the absorbance for light with a wavelength of 400 nm, the absorbance for light with a wavelength of 290 nm and light transmittance for light with a wavelength of 500 nm, the method for producing the hydroxide of a tetravalent metal element is preferably performed more "intensely". Here, "intensely" means an intense (rapid) pH increase when the pH of the reaction system increases as the reaction proceeds. In order to adjust these absorbance and light transmittance values to the prescribed ranges, it is preferred to optimize the method for producing the hydroxide of a tetravalent metal element based on the above-mentioned tendencies. A method of controlling the absorbance and light transmittance will now be explained in greater detail.

{Alkaline Source}

A known alkaline source may be used in the alkali solution, without any particular restrictions. The alkaline source may be an organic base, inorganic base or the like. The organic base may be a nitrogen-containing organic base such as guanidine, triethylamine and chitosan; a nitrogen-containing heterocyclic organic base such as pyridine, piperidine, pyrrolidine and imidazole; an ammonium salt such as ammonium carbonate, ammonium hydrogencarbonate, tetramethylammonium hydroxide (TMAH), tetraethylammonium hydroxide, tetramethylammonium chloride and tetraethylammonium chloride. Inorganic bases may be ammonia and inorganic salts of alkali metals such as lithium hydroxide, sodium hydroxide, potassium hydroxide, calcium hydroxide, lithium carbonate, sodium carbonate, potassium carbonate, lithium hydrogencarbonate, sodium hydrogencarbonate and potassium hydrogencarbonate. The alkaline source used may be a single type or a combination of two or more types.

From the viewpoint of further improving the polishing rate for insulating materials, the alkaline source is preferably at least one selected from the group consisting of ammonia and imidazole, and even more preferably imidazole. In order to increase the absorbance for light with a wavelength of 400 nm and the absorbance for light with a wavelength of 290 nm, the alkaline source used is preferably an alkaline source exhibiting weak basicity. Among alkaline sources, nitrogen-containing heterocyclic organic bases are preferred, at least one selected from the group consisting of pyridine, piperidine, pyrrolidine and imidazole are more preferred, at least one selected from the group consisting of pyridine and imidazole are even more preferred, and imidazole is especially preferred.

{Concentration}

The absorbance for light with a wavelength of 400 nm, the absorbance for light with a wavelength of 290 nm and the light transmittance for light with a wavelength of 500 nm can be varied by controlling the raw material concentrations in the metal salt solution and alkali solution. Specifically, the absorbance will tend to be increased with a higher metal salt concentration of the metal salt solution, while the absorbance will tend to be increased with a lower alkaline concentration (base concentration, alkaline source concentration) of the alkali solution. Also, the light transmittance will tend to be increased with a higher metal salt concentration, while the light transmittance will tend to be increased with a lower alkaline concentration.

From the viewpoint of easily obtaining both excellent polishing rate and excellent stability of the abrasive grains, the upper limit for the metal salt concentration of the metal salt solution is preferably 1.000 mol/L or less, more preferably 0.500 mol/L or less, even more preferably 0.300 mol/L or less and especially preferably 0.200 mol/L or less, based on the total metal salt solution. The lower limit for the metal salt concentration is preferably 0.010 mol/L or greater, more preferably 0.020 mol/L or greater and even more preferably 0.030 mol/L or greater, based on the total metal salt solution, from the viewpoint of inhibiting rapid reaction (allowing the pH increase to be more moderate) while increasing the absorbance for light with a wavelength of 400 nm, absorbance for light with a wavelength of 290 nm and light transmittance for light with a wavelength of 500 nm.

From the viewpoint of inhibiting rapid reaction, the upper limit for the alkaline concentration of the alkali solution is preferably 15.0 mol/L or less, more preferably 12.0 mol/L or less, even more preferably 10.0 mol/L or less, especially preferably 5.0 mol/L or less based on the total alkali solution. There is no particular limit on the lower limit for the alkaline concentration, but from the viewpoint of excellent productivity, it is preferably 0.001 mol/L or greater based on the total alkali solution.

The alkaline concentration of the alkali solution is preferably adjusted as appropriate depending on the type of alkaline source selected. For example, with an alkaline source wherein the pKa of the conjugate acid of the alkaline source is 20 or higher, the upper limit for the alkaline concentration is preferably 0.10 mol/L or less, more preferably 0.05 mol/L or less and even more preferably 0.01 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.001 mol/L or greater based on the total alkali solution.

With an alkaline source wherein the pKa of the conjugate acid of the alkaline source is 12 or higher and lower than 20, the upper limit for the alkaline concentration is preferably 1.0 mol/L or less, more preferably 0.50 mol/L or less and even more preferably 0.10 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.01 mol/L or greater based on the total alkali solution.

With an alkaline source wherein the pKa of the conjugate acid of the alkaline source is lower than 12, the upper limit for the alkaline concentration is preferably 15.0 mol/L or less, more preferably 10.0 mol/L or less and even more preferably 5.0 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.10 mol/L or greater based on the total alkali solution.

An example of an alkaline source wherein the pKa of the conjugate acid of the alkaline source is 20 or greater includes 1,8-diazabicyclo[5.4.0]undeca-7-ene (pKa: 25). An example of alkaline sources wherein the pKa of the conjugate acid of the alkaline source is 12 or higher and lower than 20 includes potassium hydroxide (pKa: 16) and sodium hydroxide (pKa:13). An example of alkaline sources wherein the pKa of the conjugate acid of the alkaline source is lower than 12 includes ammonia (pKa: 9) and imidazole (pKa: 7). The pKa value of the conjugate acid of the alkaline source to be used is not particularly restricted so long as the alkaline concentration is appropriately adjusted. The pKa of the conjugate acid of the alkaline source is preferably lower than 20, more preferably lower than 12, even more preferably lower than 10 and especially preferably lower than 8.

{Mixing Rate}

The absorbance for light with a wavelength of 400 nm, the absorbance for light with a wavelength of 290 nm and the light transmittance for light with a wavelength of 500 nm can be varied by controlling the mixing rate of the metal salt solution and alkali solution. The absorbance and light transmittance respectively tend to be increased when the pH increase is moderate (slow). More specifically, the absorbance tends to be higher when the mixing rate is decreased, while the absorbance tends to be lower when the mixing rate is increased. Also, the light transmittance tends to be higher when the mixing rate is decreased, while the light transmittance tends to be lower when the mixing rate is increased.

The upper limit for the mixing rate is preferably $5.00 \times 10^{-3}$ m³/min (5 L/min) or less, more preferably $1.00 \times 10^{-3}$ m³/min (1 L/min) or less, even more preferably $5.00 \times 10^{-4}$ m³/min (500 mL/min) or less and especially preferably $1.00 \times 10^{-4}$ m³/min (100 mL/min) or less, from the viewpoint of further inhibiting rapid reaction while further inhibiting local imbalance of the reaction. The lower limit for the mixing rate is not particularly restricted, but is preferably $1.00 \times 10^{-7}$ m³/min (0.1 mL/min) or greater from the viewpoint of excellence in productivity.

{Stirring Speed}

By controlling the stirring speed for mixing of the metal salt solution and the alkali solution, it is possible to vary the light transmittance for light with a wavelength of 500 nm. Specifically, the light transmittance tends to be higher when the stirring speed is increased, while the light transmittance tends to be lower when the stirring speed is decreased.

From the viewpoint of further inhibiting local imbalance of the reaction and obtaining excellent mixing efficiency, the lower limit for the stirring speed is preferably 30 min⁻¹ or greater, more preferably 50 min⁻¹ or greater and even more preferably 80 min⁻¹ or greater. The upper limit for the stirring speed is not particularly restricted, and it will need to be appropriately adjusted depending on the size and shape of the stirring blade, but it is preferably 1000 min⁻¹ or less from the viewpoint of preventing splashing of liquid.

{Liquid Temperature (Synthesis Temperature)}

By controlling the liquid temperature of the liquid mixture obtained by mixing the tetravalent metal element salt and the alkaline source, it is possible to vary the absorbance for light with a wavelength of 400 nm, the absorbance for light with a wavelength of 290 nm and the light transmittance for light with a wavelength of 500 nm, and to obtain abrasive grains that allow the desired polishing rate and storage stability to be achieved. Specifically, the absorbance tends to be higher when the liquid temperature is reduced, while the absorbance tends to be lower when the liquid temperature is increased. Also, the light transmittance tends to be higher when the liquid temperature is reduced, while the light transmittance tends to be lower when the liquid temperature is increased.

The liquid temperature is, for example, the temperature in the liquid mixture as read from a thermometer set in the liquid mixture, and it is preferably 0° C. to 100° C. The upper limit for the liquid temperature is preferably 100° C. or less, more preferably 60° C. or less, even more preferably 55° C. or less, especially preferably 50° C. or less and extremely preferably 45° C. or less, from the viewpoint of allowing rapid reaction to be inhibited. From the viewpoint of facilitating progression of the reaction, the lower limit for the liquid temperature is preferably 0° C. or greater, more preferably 10° C. or greater and even more preferably 20° C. or greater.

The hydroxide of a tetravalent metal element synthesized by the method above sometimes contains impurities (for example, metal impurities), but the impurities can be removed by washing. Washing of the hydroxide of a tetravalent metal element may be accomplished by a method of repeated solid-liquid separation by centrifugal separation or the like. Washing can also be accomplished by ion removal, using centrifugal separation, dialysis, ultrafiltration, an ion exchange resin, or the like. The absorbance for light with a wavelength of 450 to 600 nm can be adjusted by removing impurities.

When the obtained abrasive grains are aggregated, they can be dispersed in water by an appropriate method. The method for dispersing the abrasive grains in water as the major dispersing medium may be mechanical dispersion treatment with a homogenizer, ultrasonic disperser, wet ball mill or the like, in addition to dispersion treatment with a stirrer. The dispersion method and particle diameter control method may be the methods described in Non-Patent Literature 1, for example. Also, the washing treatment above may be carried out to lower the electric conductivity of the dispersion containing the abrasive grains (500 mS/m or less, for example), thereby increasing the dispersibility of the abrasive grains. Thus, the washing treatment above may be applied as dispersion treatment, or the washing treatment above and dispersion treatment may be combined.

(Additives)

The polishing liquid of the embodiment comprises an additive. Here, "additive" refers to a substance that is contained in the polishing liquid in addition to the liquid medium and the abrasive grain, in order to adjust the polishing properties such as polishing rate and polishing selectivity; the polishing liquid properties such as abrasive grain dispersibility and storage stability; and the like.

[Essential Additive: Branched Polymer]

The polishing liquid of the embodiment comprises, as an essential additive, a branched polymer including a first molecular chain having a functional group directly bonded thereto, and a second molecular chain branched from the first molecular chain. The functional group is at least one selected from the group consisting of a carboxyl group, a carboxylic acid salt group, a hydroxyl group, a sulfo group and a sulfonic acid salt group. An example of salts with respect to the carboxylic acid salt group and the sulfonic acid salt group includes a sodium salt, a potassium salt, an ammonium salt and an amine salt. The branched polymer has an effect of minimizing excessive increase in the polishing rate for a stopper material (for example, silicon nitride) (the effect as a polishing retarder). The branched polymer can be used to thereby inhibit polishing of an insulating material (for example, silicon oxide) after exposing of a stopper, thereby allowing high flatness to be obtained. It is conjectured that a specified functional group directly bonded to the first molecular chain can adsorb to an insulating material and a stopper material and be used for covering, thereby moderating progression of polishing by the abrasive grain to inhibit excessive increase in the polishing rate.

The branched polymer that can be used is not particularly restricted as long as it is the polymer including a first molecular chain having the specified functional group directly bonded thereto, and a second molecular chain branched from the first molecular chain. An example of the branched polymer includes a so-called comb-type polymer. It is noted that an atom constituting the functional group directly bonded to the first molecular chain does not correspond to an atom constituting the second molecular chain.

The "directly bonded to the first molecular chain" with respect to the functional group refers to binding of the functional group to an atom constituting the first molecular chain via no other atom at all. The first molecular chain may be the longest molecular chain among molecular chains constituting the branched polymer. The second molecular chain is a side chain of the first molecular chain. The first molecular chain and/or the second molecular chain may be a carbon chain.

The first molecular chain of the branched polymer preferably comprises at least one selected from the group consisting of a structural unit derived from styrene, a structural unit derived from olefin, a structural unit derived from acrylic acid, a structural unit derived from methacrylic acid, a structural unit derived from maleic acid and a structural unit derived from vinyl acetate, from the viewpoint of easily polishing an insulating material at a high polishing rate and also easily adequately lowering the polishing rate for a stopper material. An example of olefins includes ethylene and propylene. The first molecular chain of the branched polymer preferably comprises at least one selected from the group consisting of a polyester chain, a polyurethane chain and a polyamide chain, from the viewpoint of easily polishing an insulating material at a high polishing rate and also easily adequately lowering the polishing rate for a stopper material. The first molecular chain of the branched polymer preferably comprises at least one selected from the group consisting of a polystyrene chain, a polyolefin chain (polyethylene chain, polypropylene chain, and the like), a polyester chain, a polyurethane chain, a polyamide chain, a polyacrylic acid chain (polyacrylic chain), a polymethacrylic acid chain (polymethacrylic chain), a polymaleic acid chain, a polyvinyl acetate chain, and a copolymer chain having a structural unit of such a polymer chain, from the viewpoint of easily polishing an insulating material at a high polishing rate and also easily adequately lowering the polishing rate for a stopper material.

The structural unit in the copolymer chain may have any desired sequence. An example of the copolymer chain includes (a) a block copolymer chain with the same structural units in continuity, (b) a random copolymer chain with a structural unit A and a structural unit B arranged in no particular order, and (c) an alternating copolymer chain with a structural unit A and a structural unit B in an alternating arrangement.

The branched polymer may have at least one selected from the group consisting of a hydrophilic molecular chain and a hydrophobic molecular chain in the first molecular chain and/or the second molecular chain. The branched polymer may have a hydrophilic structural unit and/or a hydrophilic polymer chain, or a hydrophobic structural unit and/or a hydrophobic polymer chain, in the first molecular chain and/or the second molecular chain. An example of the hydrophilic structural unit includes a structural unit derived from vinyl alcohol, a structural unit derived from vinylpyrrolidone, a structural unit derived from acrylic acid, a structural unit derived from methacrylic acid and a structural unit derived from maleic acid. An example of the hydrophilic polymer chain includes a polyether chain, a polyvinyl alcohol chain and a polyvinylpyrrolidone chain. An example of the hydrophobic structural unit includes a structural unit derived from styrene, a structural unit derived from olefin and a structural unit derived from vinyl acetate. An example of the hydrophobic polymer chain includes a polyester chain, a polyurethane chain and a polyamide chain.

The first molecular chain of the branched polymer preferably comprises at least one selected from the group consisting of a polymaleic acid chain and a copolymer chain having a hydrophobic structural unit and a hydrophilic structural unit, from the viewpoint of easily polishing an insulating material at a high polishing rate and also easily adequately lowering the polishing rate for a stopper material while inhibiting aggregation of the abrasive grain. The copolymer chain having a hydrophobic structural unit and a hydrophilic structural unit is preferably at least one selected from the group consisting of a styrene-acrylic acid copolymer chain, a styrene-methacrylic acid copolymer chain and a styrene-maleic acid copolymer chain, from the viewpoint of easily polishing an insulating material at a high polishing rate and also easily adequately lowering the polishing rate for a stopper material while inhibiting aggregation of the abrasive grain.

The second molecular chain preferably comprises at least one selected from the group consisting of a hydrophilic molecular chain and a hydrophobic molecular chain, from the viewpoint of allowing dispersion stability of the abrasive grain to be easily kept. This allows polishing selectivity and flatness to be further improved while allowing aggregation of the abrasive grain (for example, abrasive grain comprising a hydroxide of a tetravalent metal element) to be inhibited.

The hydrophilic molecular chain preferably comprises at least one selected from the group consisting of a polyether chain, a polyvinyl alcohol chain and a polyvinylpyrrolidone chain, more preferably comprises a polyether chain, from the viewpoint of easily polishing an insulating material at a high polishing rate and also easily adequately lowering the polishing rate for a stopper material while inhibiting aggregation of the abrasive grain. The polyether chain preferably comprises a polyoxyalkylene chain, more preferably comprises at least one selected from the group consisting of a polyoxyethylene chain, a polyoxypropylene chain and a polyoxyethylene-polyoxypropylene chain, from the viewpoint of easily polishing an insulating material at a high polishing rate and also easily adequately lowering the polishing rate for a stopper material while inhibiting aggregation of the abrasive grain.

The hydrophobic molecular chain preferably comprises at least one selected from the group consisting of a structural unit derived from styrene, a structural unit derived from olefin, a structural unit derived from acrylic acid, a structural unit derived from methacrylic acid, a structural unit derived from maleic acid, a structural unit derived from vinyl acetate, a polyester chain, a polyurethane chain and a polyamide chain, more preferably comprises at least one selected from the group consisting of a polystyrene chain, a polyolefin chain (for example, a polyethylene chain and a polypropylene chain), a polyvinyl acetate chain, a polyester chain, a polyurethane chain and a polyamide chain, even more preferably comprises at least one selected from the group consisting of a polystyrene chain and a polyolefin chain, especially preferably comprises a polystyrene chain, from the viewpoint of easily polishing an insulating material at a high polishing rate and also easily adequately lowering the polishing rate for a stopper material while inhibiting aggregation of the abrasive grain.

As the branched polymer, one having the above-mentioned structure can be used among those commonly used as dispersing agents of particles and the like. For example, wet dispersing agents commercially available as "DISPERBYK-190" (by BYK-Chemie GmbH, polyalkylene glycol-modified styrene-maleic acid copolymer), "TEGO Dispers 755W" (by Evonik Industries, polyethylene glycol-modified styrene-maleic acid copolymer), "TEGO Dispers 765W" (by Evonik Industries), "DISPERBYK-2015" (by BYK-Chemie GmbH), "Floren GW-1500" (by Kyoeisha Chemical Co., Ltd.), and the like can be used. DISPERBYK-190 and TEGO Dispers 755W are each a polymer having a branched (comb-type) structure, have a copolymer chain of styrene-maleic acid, have a carboxyl group as a functional group directly bonded to the copolymer chain, and have a hydrophilic polyoxyalkylene chain (TEGO Dispers 755W has a polyoxyethylene chain) branched from the copolymer chain. TEGO Dispers 765W is a polymer having a branched (comb-type) structure, has a carboxyl group as a functional group directly bonded to the polymer chain, and is a high-molecular weight polymer having a pigment-affinic functional group. DISPERBYK-2015 is a polymer having a branched (comb-type) structure, is an acrylic copolymer obtained by control polymerization, and has a carboxyl group as a functional group directly bonded to the polymer chain. Floren GW-1500 is a polymer having a branched (comb-type) structure, and has a carboxyl group as a functional group directly bonded to the polymer chain.

In the polishing liquid of the embodiment, the branched polymer used may be a single type or a combination of two or more types for the purpose of adjustment of polishing properties such as polishing selectivity and flatness.

The upper limit for the weight-average molecular weight of the branched polymer is not particularly restricted, and is preferably 200000 or less, more preferably 100000 or less, even more preferably 70000 or less, especially preferably 50000 or less, extremely preferably 30000 or less, from the viewpoint of obtaining proper workability and foamability. The lower limit for the weight-average molecular weight of the branched polymer is preferably 500 or greater, more preferably 1000 or greater, even more preferably 2000 or greater, especially preferably 5000 or greater, extremely preferably 10000 or greater, very preferably 15000 or greater, still more preferably 20000 or greater, from the viewpoint of further improving polishing selectivity and flatness. The weight-average molecular weight can be measured by gel permeation chromatography (GPC) under the following conditions, using a calibration curve of standard polystyrene, for example.

Device used: ACQUITY APC system [by Waters]
Column: Waters ACQUITY APC XT 200+Waters ACQUITY APC XT 45+Waters ACQUITY APC XT 45 [total of 3, trade name of Waters]
Eluent: Tetrahydrofuran
Column temperature: 45° C.
Detector: ACQUITY differential refractometer (RI) detector [by Waters]
RI temperature: 45° C.
Data processing: Empower 3 [by Waters]
Amount injected: 10 μL The upper limit for the acid value of the branched polymer is preferably 150 mgKOH/g or less, more preferably 120 mgKOH/g or less, even more preferably 100 mgKOH/g or less, especially preferably 80 mgKOH/g or less, extremely preferably 60 mgKOH/g or less, from the viewpoint of easily polishing an insulating material at a high polishing rate and also easily adequately lowering the polishing rate for a stopper material while inhibiting aggregation of the abrasive grain. The lower limit for the acid value of the branched polymer is preferably 1 mgKOH/g or greater, more preferably 5 mgKOH/g or greater, even more preferably 10 mgKOH/g or greater, from the viewpoint of easily polishing an insulating material at a high polishing rate and also easily adequately lowering the polishing rate for a stopper material while inhibiting aggregation of the abrasive grain.

The acid value can be measured by the following procedure, for example. First, a proper amount of a solution including a polymer whose acid value is to be measured is accurately weighed, and thereafter a proper amount of purified water is added to this solution to uniformly dissolve the polymer, thereby obtaining a resin solution. Next, a proper amount of phenolphthalein as an indicator is added to the resin solution, and thereafter an aqueous 0.1 N KOH solution is used to perform titration. The acid value can be then calculated according to the formula below. In the formula, A represents the acid value (mgKOH/g), V represents the amount of an aqueous 0.1 N KOH solution for titration (mL), f represents the factor of an aqueous 0.1 N KOH solution, Wp represents the mass (g) of the resin solution, and I represents the proportion (mass %) of a non-volatile content in the resin solution.

$$A = V \times f \times 5.611/(Wp \times I)$$

The lower limit for the content of the branched polymer is preferably 0.001 mass % or greater, more preferably 0.005 mass % or greater, even more preferably 0.01 mass % or greater, especially preferably 0.02 mass % or greater, extremely preferably 0.03 mass % or greater based on the total mass of the polishing liquid, from the viewpoint of further improving polishing selectivity and flatness. The upper limit for the content of the branched polymer is preferably 0.5 mass % or less, more preferably 0.1 mass % or less, even more preferably 0.05 mass % or less based on the total mass of the polishing liquid, from the viewpoint of easily obtaining a proper polishing rate. When a plurality of compounds is to be used as the branched polymer, the total content of each of the compounds preferably satisfies the range specified above.

[Optional Additive]

The polishing liquid of the embodiment may further comprise, in addition to the essential additive, optional additive (excluding any compound corresponding to the branched polymer) for the purpose of adjustment of polishing properties. An example of the optional additive includes a polyoxyalkylene compound, a cationic polymer, carboxylic acids, amino acids, a water-soluble polymer and an antioxidant (for example, hydrogen peroxide). Each of such additives used may be a single type or a combination of two or more types.

The optional additive has an effect of further minimizing excessive increase in the polishing rate for a stopper material (for example, silicon nitride). The optional additive can also be used to thereby inhibit polishing of insulating materials (for example, silicon oxide) after exposing of a stopper, thereby achieving further higher flatness. It is conjectured that covering of insulating materials and a stopper material with the optional additive moderates progression of polishing by the abrasive grain to thereby inhibit excessive increase in the polishing rate.

An example of the polyoxyalkylene compound includes polyalkylene glycols and polyoxyalkylene derivatives.

An example of the polyalkylene glycols includes polyethylene glycol, polypropylene glycol and polybutylene glycol. The polyalkylene glycols are each preferably at least one selected from the group consisting of polyethylene glycol and polypropylene glycol, more preferably polyethylene glycol.

The polyoxyalkylene derivatives are each, for example, a compound where a functional group or substituent is introduced into polyalkylene glycol, or a compound where polyalkylene oxide is added to an organic compound. An example of the functional group or substituent includes an alkyl ether group, an alkyl phenyl ether group, a phenyl ether group, a styrenated phenyl ether group, a glyceryl ether group, an alkylamine group, a fatty acid ester group and a glycol ester group. An example of the polyoxyalkylene derivatives includes polyoxyethylene alkyl ethers, polyoxyethylene styrenated phenyl ethers (for example, Emulgen series by Kao Corporation), polyoxyethylene alkyl phenyl ethers (for example, Noigen EA series by DKS Co., Ltd.,), polyoxyalkylene polyglyceryl ethers (for example, SC-E series and SC-P series by Sakamoto Yakuhin Kogyo Co., Ltd.), polyoxyethylene sorbitan fatty acid esters (for example, Sorgen TW series by DKS Co., Ltd.), polyoxyethylene fatty acid esters (for example, Emanon series by Kao Corporation), polyoxyethylene alkylamines (for example, Amirazine D by DKS Co., Ltd.), and other compounds where polyalkylene oxide is added (for example, Surfynol 465 by Nissin Chemical Co., Ltd., and TMP series and BAP4-30H by Nippon Nyukazai Co., Ltd.).

The upper limit for the weight-average molecular weight of the polyoxyalkylene compound is not particularly restricted, and is preferably 100000 or less, more preferably 50000 or less, even more preferably 20000 or less, especially preferably 10000 or less, extremely preferably 5000 or less, from the viewpoint of obtaining proper workability and foamability. The lower limit for the weight-average molecular weight of the polyoxyalkylene compound is preferably 200 or greater, more preferably 400 or greater, even more preferably 500 or greater, especially preferably 1000 or greater, extremely preferably 1500 or greater, from the viewpoint of further improving polishing selectivity and flatness. The weight-average molecular weight can be measured by gel permeation chromatography (GPC) under the following conditions, using a calibration curve of standard polystyrene, for example.

Device used: Hitachi Model L-6000 [product of Hitachi, Ltd.]

Column: GL-R420 Gel pack +GL-R430 Gel pack +GL-R440 Gel pack [total of 3, trade name of Hitachi Chemical Co., Ltd.]

Eluent: Tetrahydrofuran

Measuring temperature: 40° C.

Flow rate: 1.75 mL/min

Detector: L-3300RI [Hitachi, Ltd.]

The lower limit for the content of the polyoxyalkylene compound is preferably 0.01 mass % or greater, more preferably 0.02 mass % or greater, even more preferably 0.1 mass % or greater, especially preferably 0.3 mass % or greater, extremely preferably 0.4 mass % or greater, very preferably 0.5 mass % or greater based on the total mass of the polishing liquid, from the viewpoint of further improving polishing selectivity and flatness. The upper limit for the content of the polyoxyalkylene compound is preferably 5 mass % or less, more preferably 2 mass % or less, even more preferably 1 mass % or less based on the total mass of the polishing liquid, from the viewpoint of easily obtaining a proper polishing rate. When a plurality of compounds is to be used as the polyoxyalkylene compound, the total content of each of the compounds preferably satisfies the range specified above.

The cationic polymer is defined as a polymer having a cationic group or a group capable of being ionized to a cationic group in a main chain or a side chain. An example of the cationic group includes an amino group, an imino group and a cyano group.

The cationic polymer is used in combination with the polyoxyalkylene compound, thereby exerting the effect of further inhibiting excessive increase in the polishing rate for a stopper material. The cationic polymer can inhibit the polishing rate for insulating materials from being lowered due to excessive covering of not only a stopper material but also insulating materials with the polyoxyalkylene compound, and also has an effect of improving the polishing rate for insulating materials. Therefore, it is considered that, when the polyoxyalkylene compound and the cationic polymer are used in combination, the cationic polymer can interact with the polyoxyalkylene compound, thereby further lowering the polishing rate for a stopper material and also improving the polishing rate for insulating materials.

The cationic polymer can be obtained by polymerizing at least one monomer component selected from the group consisting of allylamine, diallylamine, vinylamine, ethyleneimine and their derivatives. The cationic polymer is, for example, at least one selected from the group consisting of an allylamine polymer, a diallylamine polymer, a vinylamine polymer and an ethyleneimine polymer.

An allylamine polymer is a polymer obtained by polymerizing allylamine or its derivative. An example of the allylamine derivative includes alkoxycarbonylated allylamine, methylcarbonylated allylamine, aminocarbonylated allylamine and ureated allylamine.

A diallylamine polymer is a polymer obtained by polymerizing diallylamine or its derivative. An example of the diallylamine derivative includes methyldiallylamines, diallyldimethylammonium salts, diallylmethylethylammonium salts, acylated diallylamine, aminocarbonylated diallylamine, alkoxycarbonylated diallylamine, aminothiocarbonylated diallylamine and hydroxyalkylated diallylamine. An example of the ammonium salt includes ammonium chloride and ammonium alkyl sulfates (for example, ammonium ethyl sulfate).

A vinylamine polymer is a polymer obtained by polymerizing vinylamine or its derivative. An example of the vinylamine derivative includes alkylated vinylamine, amidated vinylamine, ethylene oxidated vinylamine, propylene oxidated vinylamine, alkoxylated vinylamine, carboxymethylated vinylamine, acylated vinylamine and ureated vinylamine.

An ethyleneimine polymer is a polymer obtained by polymerizing ethyleneimine or its derivative. An example of the ethyleneimine derivative includes aminoethylated acrylic polymers, alkylated ethyleneimine, ureated ethyleneimine and propylene oxidated ethyleneimine.

The cationic polymer may have a structural unit derived from a monomer component other than allylamine, diallylamine, vinylamine, ethyleneimine and their derivatives, and may have a structural unit derived from acrylamide, dimethylacrylamide, diethylacrylamide, hydroxyethyl acrylamide, acrylic acid, methyl acrylate, methacrylic acid, maleic acid, sulfur dioxide or the like.

The cationic polymer may be a homopolymer of allylamine, diallylamine, vinylamine or ethyleneimine (polyallylamine, polydiallylamine, polyvinylamine or polyethyleneimine), or it may be a copolymer having a structural unit derived from allylamine, diallylamine, vinylamine, ethyleneimine or a derivative thereof. The structural unit in the copolymer may have any desired sequence. An example of the copolymer includes (a) a block copolymer with the same structural units in continuity, (b) a random copolymer with a structural unit A and a structural unit B arranged in no particular order, and (c) an alternating copolymer with a structural unit A and a structural unit B in an alternating arrangement.

The lower limit for the weight-average molecular weight of the cationic polymer is preferably 100 or greater, more preferably 300 or greater, even more preferably 500 or greater, especially preferably 1000 or greater, extremely preferably 10000 or greater, very preferably 100000 or greater, still more preferably 200000 or greater, from the viewpoint of further improving the polishing selectivity for insulating material with respect to stopper material. The upper limit for the weight-average molecular weight of the cationic polymer is preferably 1000000 or less, more preferably 600000 or less, even more preferably 300000 or less, from the viewpoint of further improving the polishing selectivity for insulating material with respect to stopper material.

The weight-average molecular weight of the cationic polymer can be measured by gel permeation chromatography (GPC) under the following conditions, using a calibration curve of standard polystyrene, for example.

Device used: Hitachi Model L-6000 [product of Hitachi, Ltd.]

Column: GL-R420 Gel pack +GL-R430 Gel pack +GL-R440 Gel pack [total of 3, trade name of Hitachi Chemical Co., Ltd.]

Eluent: Tetrahydrofuran

Measuring temperature: 40° C.

Flow rate: 1.75 mL/min

Detector: L-3300RI [Hitachi, Ltd.]

The lower limit for the content of the cationic polymer is preferably 0.0001 mass % or greater, more preferably 0.0002 mass % or greater, even more preferably 0.0005 mass % or greater, especially preferably 0.001 mass % or greater, extremely preferably 0.002 mass % or greater, very preferably 0.003 mass % or greater based on the total mass of the polishing liquid, from the viewpoint of further improving polishing selectivity and flatness. The upper limit for the content of the cationic polymer is preferably 5 mass % or less, more preferably 3 mass % or less, even more preferably 1 mass % or less, especially preferably 0.5 mass % or less, extremely preferably 0.1 mass % or less, very preferably 0.05 mass % or less, still more preferably 0.01 mass % or less based on the total mass of the polishing liquid, from the viewpoint of further improving the polishing selectivity. When a plurality of compounds is to be used as the cationic polymer, the total content of each of the compounds preferably satisfies the range specified above. The content of the cationic polymer is preferably adjusted as appropriate depending on the method of preparing the insulating material (for example, the type and the film use conditions), from the viewpoint of further improving the polishing rate for insulating materials, polishing selectivity for insulating material with respect to stopper material, and flatness.

When carboxylic acid, amino acid, a water-soluble polymer or an antioxidant is used, the content thereof is preferably 0.0001 mass % or greater and 10 mass % or less based on the total mass of the polishing liquid, from the viewpoint of obtaining the effect of adding the additive while minimizing sedimentation of the abrasive grain. When a plurality of compounds is used as each of these additives, the total content of each of the compounds preferably satisfies the range specified above.

A carboxylic acid has an effect of stabilizing the pH while further improving the polishing rate for insulating materials. An example of the carboxylic acid includes formic acid, acetic acid, propionic acid, butyric acid, valeric acid, caproic acid and lactic acid.

An amino acid has an effect of improving the dispersibility of the abrasive grains (for example, abrasive grains containing the hydroxide of a tetravalent metal element), and further improving the polishing rate for insulating materials. An example of the amino acid includes arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

The water-soluble polymer has an effect of adjusting the polishing properties such as flatness, in-plane uniformity, polishing selectivity for silicon oxide with respect to silicon nitride (polishing rate for silicon oxide/polishing rate for silicon nitride), and polishing selectivity for silicon oxide with respect to polysilicon (polishing rate for silicon oxide/polishing rate for polysilicon). A "water-soluble polymer" is defined as a polymer dissolved to at least 0.1 g in 100 g of water. A polymer corresponding to the branched polymer, the polyoxyalkylene compound or the cationic polymer is not included in the "water-soluble polymer".

There are no particular restrictions on the water-soluble polymer, and an example thereof includes acrylic polymers such as polyacrylamides and polydimethylacrylamides; polysaccharides such as alginic acid, pectic acid, carboxymethyl cellulose, agar, curdlan, dextrin, cyclodextrin and pullulan; vinyl-based polymers such as polyvinyl alcohol, polyvinylpyrrolidone and polyacrolein; glycerin-based polymers such as polyglycerin and polyglycerin derivatives; and polyethylene glycol. The water-soluble polymer may be used as a single type or as a combination of two or more types.

When the water-soluble polymer is used, the lower limit for the content of the water-soluble polymer is preferably 0.0001 mass % or greater, more preferably 0.001 mass % or greater, even more preferably 0.01 mass % or greater based on the total mass of the polishing liquid, from the viewpoint of obtaining the effect of adding the water-soluble polymer while minimizing sedimentation of the abrasive grain. The upper limit for the content of the water-soluble polymer is preferably 10 mass % or less, more preferably 5 mass % or less, even more preferably 1 mass % or less, especially preferably 0.5 mass % or less based on the total mass of the polishing liquid, from the viewpoint of obtaining the effect of adding the water-soluble polymer while minimizing sedimentation of the abrasive grain. When a plurality of compounds is to be used as the water-soluble polymer, the total content of each of the compounds preferably satisfies the range specified above.

(Liquid Medium)

The liquid medium in the polishing liquid of the embodiment is not particularly restricted, and is preferably water such as deionized water and ultrapurified water. The content of the liquid medium may correspond to the remainder of the polishing liquid, where the contents of other constituent components are removed, and is not particularly limited.

(Polishing Liquid Properties)

The pH (25° C.) of the polishing liquid of the embodiment is preferably 2.0 to 8.0 from the viewpoint of further improving storage stability of the polishing liquid and an effect of inhibiting polishing of a stopper material. The pH of the polishing liquid mainly has an effect on the polishing rate. The lower limit for the pH is more preferably 2.5 or greater, even more preferably 3.0 or greater, especially preferably 3.5 or greater, extremely preferably 4.0 or greater, very preferably 5.0 or greater, still more preferably 6.0 or greater, from the viewpoint of further improving the polishing rate for insulating materials. The upper limit for the pH is more preferably 7.5 or less, even more preferably 7.0 or less, from the viewpoint of further improving the effect of inhibiting polishing of a stopper material.

The pH of the polishing liquid can be adjusted with an acid component such as an inorganic acid or organic acid; an alkaline component such as ammonia, sodium hydroxide, tetramethylammonium hydroxide (TMAH) or imidazole; or the like. A buffering agent may be added to stabilize the pH. A buffering agent may be added as a buffer solution (a buffering agent-containing solution). An example of such buffer solutions includes acetate buffer solutions and phthalate buffer solutions.

The pH of the polishing liquid of the embodiment can be measured with a pH meter (for example, a Model PHL-40 by DKK Corp.). Specifically, for example, after 2-point calibration of a pH meter using phthalate pH buffer solution (pH: 4.01) and a neutral phosphate pH buffer solution (pH: 6.86) as standard buffer solutions, the pH meter electrode was placed in the polishing liquid, and then the value was measured after at least 2 minutes passed for stabilization. Here, the liquid temperature of the standard buffer solution and polishing liquid are both 25° C.

The polishing liquid of the embodiment may be stored as a one-pack polishing liquid containing at least the abrasive grain, the branched polymer and the liquid medium, or it may be stored as a multi-pack (for example, two-pack) polishing liquid set comprising constituent components of the polishing liquid divided into a slurry (first liquid) and an additive solution (second liquid) so that the slurry and additive solution are mixed to form the polishing liquid. The slurry contains at least the abrasive grain and the liquid medium, for example. The additive solution contains at least the branched polymer and the liquid medium, for example. Between the slurry and the additive solution, the branched polymer, optional additive and the buffering agent are preferably contained in the additive solution. The constituent components of the polishing liquid may be stored as a polishing liquid set divided into three or more liquids.

In the polishing liquid set, the slurry and the additive solution are mixed immediately before polishing or during polishing to prepare the polishing liquid. Also, a one-pack polishing liquid may be stored as a polishing liquid storage solution with a reduced liquid medium content, and used by dilution with a liquid medium at the time of polishing. A multi-pack polishing liquid set may be stored as a slurry storage solution and additive solution storage solution with reduced liquid medium contents, and used by dilution with a liquid medium at the time of polishing.

In the case of a one-pack polishing liquid, the method used to supply the polishing liquid onto the polishing platen may be a method of supplying the polishing liquid by direct liquid conveyance; a method of separately conveying the polishing liquid storage solution and liquid medium through tubings, merging them to mix, and then supplying; or a method of mixing the polishing liquid storage solution and liquid medium beforehand and then supplying.

For storage as a multi-pack polishing liquid set separately comprising a slurry and additive solution, the polishing rate can be adjusted by optionally varying the composition of these liquids. When a polishing liquid set is used for polishing, the following method may be used as the method for supplying the polishing liquid onto the polishing platen. For example, there may be employed a method of separately conveying the slurry and additive solution through tubings, merging these tubings to mix, and then supplying; a method of separately conveying the slurry storage solution, additive solution storage solution and liquid medium through tubings, merging them to mix, and then supplying; a method of mixing the slurry and additive solution beforehand and then supplying; or a method of mixing the slurry storage solution, additive solution storage solution and liquid medium beforehand and then supplying. There may also be employed a method in which the slurry and additive solution of the polishing liquid set are each supplied onto the polishing platen. In this case, the polishing liquid obtained by mixing the slurry and additive solution on the polishing platen is used for polishing of the surface to be polished.

The polishing liquid set of the embodiment may be an aspect where the polishing liquid containing at least the above-mentioned essential component and the additive solution containing at least optional component such as an antioxidant (for example, hydrogen peroxide) are separated. In this case, a liquid mixture (the liquid mixture also corresponds to "polishing liquid") obtained by mixing the polishing liquid and the additive solution is used to perform polishing. The polishing liquid set of the embodiment may be an aspect where, a liquid containing at least a part of the above-mentioned essential component, a liquid containing at least the remainder of the above-mentioned essential component, and the additive solution containing at least optional component are separated as a three- or more-pack polishing liquid set. Each of the liquids constituting the polishing liquid set may be stored as the storage solution having a reduced content of the liquid medium.

<Polishing Method for Base Substrate>

The polishing method for a base substrate of the embodiment may comprise a polishing step of polishing the surface to be polished of a base substrate using the one-pack polishing liquid, or it may comprise a polishing step of polishing the surface to be polished of a base substrate using the polishing liquid obtained by mixing the slurry and the additive solution of the polishing liquid set.

Also, the polishing method for a base substrate of the embodiment may be a polishing method for a base substrate having an insulating material and silicon nitride, and for example, it may comprise a polishing step of selectively polishing the insulating material with respect to the silicon nitride using the one-pack polishing liquid, or the polishing liquid obtained by mixing the slurry and the additive solution of the polishing liquid set. In this case, the base substrate may have a member comprising the insulating material and a member comprising the silicon nitride, for example. "Selectively polish material A with respect to material B" means that the polishing rate for material A is higher than the polishing rate for material B under the same polishing conditions. More specifically, it means, for example, that material A is polished with the polishing rate ratio of the polishing rate for material A with respect to the polishing rate for material B being 10 or greater.

The polishing method for a base substrate of the embodiment may be a polishing method for a base substrate having an insulating material and polysilicon, and may comprise a polishing step of selectively polishing an insulating material with respect to polysilicon using the one-pack polishing liquid, or a polishing liquid obtained by mixing the slurry and the additive solution of the polishing liquid set, for example. In this case, the base substrate may have a member comprising an insulating material and a member comprising polysilicon, for example.

In the polishing step, for example, under the condition that the material to be polished of the base substrate that has the material to be polished is pressed against the abrasive pad (abrasive cloth) of a polishing platen, the polishing liquid is supplied between the material to be polished and the abrasive pad, and the base substrate and polishing platen are moved relative to each other to polish the surface to be polished of the material to be polished. For example, at least a portion of the material to be polished is removed by the polishing in the polishing step.

The base substrate that is to be polished may be a substrate or the like, and for example, it may be a substrate comprising a material to be polished formed on a substrate for semiconductor element production (for example, a semiconductor substrate in which an STI pattern, gate pattern, wiring pattern or the like has been formed). An example of the material to be polished includes an insulating material such as silicon oxide; a stopper material such as polysilicon and silicon nitride. The material to be polished may be a single material or a plurality of materials. When a plurality of materials is exposed on the surface to be polished, they may be considered as the material to be polished. The material to be polished may be in the form of a film, such as a silicon oxide film, polysilicon film and silicon nitride film.

By polishing a material to be polished (for example, an insulating material such as silicon oxide) formed on such substrate with the polishing liquid and removing the unwanted sections, it is possible to eliminate irregularities on the surface of the material to be polished and to produce a smooth surface over the entire surface of the polished material. The polishing liquid of the embodiment is preferably used for polishing of a surface to be polished containing silicon oxide.

In the embodiment, it is possible to polish an insulating material of a base substrate having an insulating material containing silicon oxide on at least the surface, a stopper (polishing stop layer) disposed as the lower layer of the insulating material, and a semiconductor substrate disposed under the stopper. The stopper material consisting of the stopper is a material with a lower polishing rate than the insulating material, and it is preferably polysilicon, silicon nitride or the like. With such a base substrate, excessive polishing of the insulating material is prevented by stopping the polishing when the stopper have exposed, and this can improve flatness of the insulating material after polishing.

An example of the forming method for a material to be polished by the polishing liquid of the embodiment includes a CVD method such as low-pressure CVD method, normal-pressure CVD method and plasma CVD method; a spin coating method in which the liquid material is coated onto the substrate that is spinning.

Silicon oxide is obtained using low-pressure CVD method, for example, by thermal reaction of monosilane ($SiH_4$) and oxygen ($O_2$). Silicon oxide is also obtained using normal-pressure CVD method, for example, by thermal reaction of tetraethoxysilane ($Si(OC_2H_5)_4$) and ozone ($O_3$). As another example, silicon oxide is likewise obtained by plasma reaction of tetraethoxysilane and oxygen.

Silicon oxide is obtained using a spin coating method, for example, by coating a liquid starting material containing inorganic polysilazane, inorganic siloxane or the like onto a substrate and conducting thermosetting reaction in a furnace body or the like.

An example of the forming method for polysilicon includes low-pressure CVD method in which monosilane is subjected to thermal reaction, and plasma CVD method in which monosilane is subjected to plasma reaction.

Example of the forming method for silicon nitride includes low-pressure CVD method in which dichlorsilane and ammonia are thermally reacted, and plasma CVD method in which monosilane, ammonia and nitrogen are subjected to plasma reaction. The silicon nitride obtained by such a method may contain elements other than silicon and nitrogen, such as carbon or hydrogen, in order to adjust the material quality.

In order to stabilize the materials such as silicon oxide, polysilicon and silicon nitride that are obtained by such methods, heat treatment may be carried out at a temperature of 200° C. to 1000° C. as necessary. The silicon oxide obtained by such methods may also contain small amounts of boron (B), phosphorus (P), carbon (C) or the like in order to increase the embedding property.

The polishing method of the embodiment will now be explained using a polishing method for a semiconductor substrate on which an insulating material has been formed, as an example. In the polishing method of the embodiment, the polishing apparatus used may be a common polishing apparatus having a holder capable of holding the base substrate (such as a semiconductor substrate) that has the surface to be polished, and a polishing platen on which an abrasive pad can be mounted. Rotational speed-variable motors or the like may be mounted on the holder and the polishing platen, respectively. An example of the polishing apparatus includes the polishing apparatus: Reflexion by Applied Materials, Inc.

The abrasive pad used may be a common nonwoven fabric, foam body, non-foam body or the like. The abrasive pad material used may be a resin such as polyurethane, acryl resin, polyester, acryl-ester copolymer, polytetrafluoroethylene, polypropylene, polyethylene, poly-4-methylpentene, cellulose, cellulose ester, polyamide (for example, nylon (trademark) and aramid), polyimide, polyimideamide, polysiloxane copolymer, oxirane compound, phenol resin, polystyrene, polycarbonate, epoxy resin and the like. Especially, the abrasive pad material is preferably at least one selected from the group consisting of polyurethane foam and non-foam polyurethane, from the viewpoint of further excellent polishing rate and flatness. The abrasive pad is preferably furrowed to allow accumulation of the polishing liquid.

There are no particular restrictions on the polishing conditions, but the upper limit for the rotational speed of the polishing platen is preferably 200 $min^{-1}$ or less so that the semiconductor substrate does not fly out, the polishing pressure (machining load) on the semiconductor substrate is preferably 100 kPa or less from the viewpoint of adequately inhibiting the generation of polishing scratches. The polishing liquid is preferably continuously supplied to the abrasive pad with a pump or the like during polishing. The amount supplied is not particularly restricted, but preferably the surface of the abrasive pad is covered by the polishing liquid at all times.

The semiconductor substrate after polishing is preferably thoroughly cleaned in flowing water to remove the particles adhering to the substrate. The cleaning may be carried out using dilute hydrofluoric acid or ammonia water in addition to purified water, and a brush may be used together to increase the cleaning efficiency. It is also preferred that, after cleaning, the water droplets adhering to the semiconductor substrate are removed off using a spin dryer or the like, and then the semiconductor substrate is dried.

The polishing liquid, polishing liquid set and polishing method of the embodiment can be suitably employed for formation of an STI. For formation of an STI, the lower limit for the polishing rate ratio of the insulating material (for example, silicon oxide) with respect to the stopper material (for example, silicon nitride) is preferably 10 or greater. If the polishing rate ratio is lower than 10, the magnitude of the polishing rate for the insulating material with respect to the polishing rate for the stopper material is small, and therefore, it will tend to be difficult to stop polishing at the prescribed location during formation of the STI. If the polishing rate ratio is 10 or greater, on the other hand, it will be easier to stop polishing, which is more suitable for STI formation. The lower limit for the polishing rate for insulating materials (for example, silicon oxide) is preferably 70 nm/min or greater, more preferably 100 nm/min or greater, even more preferably 130 nm/min or greater. The upper limit for the polishing rate for a stopper material (for example, silicon nitride) is preferably 20 nm/min or less, more preferably 10 nm/min or less, even more preferably 5 nm/min or less.

The polishing liquid, polishing liquid set and polishing method of the embodiment can also be employed for polishing of pre-metal insulating materials. An example of pre-metal insulating materials includes, in addition to silicon oxide, also phosphorus-silicate glass or boron-phosphorus-silicate glass, as well as silicon oxyfluoride and fluorinated amorphous carbon.

The polishing liquid, polishing liquid set and polishing method of the embodiment can also be employed for materials other than insulating materials such as silicon oxide. An Example of such material includes high permittivity materials such as Hf-based, Ti-based and Ta-based oxides; semiconductor materials such as silicon, amorphous silicon, SiC, SiGe, Ge, GaN, GaP, GaAs and organic semiconductors; phase-change materials such as GeSbTe; inorganic conductive materials such as ITO; and polymer resin materials such as polyimide-based, polybenzooxazole-based, acrylic, epoxy-based and phenol-based materials.

The polishing liquid, polishing liquid set and polishing method of the embodiment can be employed not only for polishing of film-like materials, but also for various types of substrates made of glass, silicon, SiC, SiGe, Ge, GaN, GaP, GaAs, sapphire or plastics.

The polishing liquid, polishing liquid set and polishing method of the embodiment can be employed not only for production of semiconductor elements, but also for production of image display devices such as TFTs and organic ELs; optical parts such as photomasks, lenses, prisms, optical fibers and single crystal scintillators; optical elements such as optical switching elements and optical waveguides; light-emitting elements such as solid lasers and blue laser LEDs; and magnetic storage devices such as magnetic disks and magnetic heads.

EXAMPLES

The present invention will now be explained in detail by examples, with the understanding that the invention is not limited to the examples.

<Synthesis of Hydroxide of a Tetravalent Metal Element>

350 g of an aqueous 50 mass % Ce $(NH_4)_2$ $(NO_3)_6$ solution (trade name: CAN50 liquid by Nihon Kagaku Sangyo Co., Ltd.) was mixed with 7825 g of purified water to obtain a solution. Next, while stirring this solution, 750 g of an aqueous imidazole solution (10 mass % aqueous solution, 1.47 mol/L) was added dropwise at a mixing rate of 5 mL/min to obtain a precipitate containing cerium hydroxide. The cerium hydroxide was synthesized at a temperature of 25° C. and a stirring speed of 400 $min^{-1}$ The stirring was carried out using a 3-blade pitch paddle with a total blade section length of 5 cm.

The obtained precipitate containing cerium hydroxide was subjected to centrifugal separation (4000 $min^{-1}$, 5 minutes), and thereafter subjected to solid-liquid separation with removal of a liquid phase by decantation. 10 g of a particle obtained by solid-liquid separation and 990 g of water were mixed, and an ultrasonic cleaner was used to disperse the particle in the water to prepare a cerium hydroxide slurry storage solution (content of particle: 1.0 mass %).

<Measurement of Mean Particle Diameter>

Upon measurement of the mean particle diameter of the particles of cerium hydroxide in the cerium hydroxide slurry storage solution using an N5, trade name of Beckman Coulter, Inc., a value of 25 nm was obtained. The measuring method was as follows. First, approximately 1 mL of measuring sample (aqueous dispersion) containing 1.0 mass % of particles of cerium hydroxide was placed in a 1 cm-square cell, and the cell was set in the N5. Measurement was performed at 25° C. with the refractive index adjusted to 1.333 and the viscosity adjusted to 0.887 mPa·s as the measuring sample information of N5 software, and the value indicated as Unimodal Size Mean was read off.

<Structural Analysis of Abrasive Grains>

A suitable amount of the cerium hydroxide slurry storage solution was taken and vacuum dried to isolate the abrasive grains, and then thoroughly washed with purified water to obtain a sample. The obtained sample was measured by FT-IR ATR method, and a peak for nitrate ion ($NO_3^-$) was observed in addition to a peak for hydroxide ion ($OH^-$). The same sample was measured by XPS (N-XPS) for nitrogen, and a peak for nitrate ion was observed while no peak for $NH_4^+$ was observed. These results confirmed that the abrasive grains in the cerium hydroxide slurry storage solution at least partially contained particles having nitrate ion bonded to cerium element. Also, since it at least partially contained particles having hydroxide ion bonded to cerium element, this confirmed that the abrasive grains contained cerium hydroxide. It was confirmed from these results that the cerium hydroxide contained a hydroxide ion bonded to a cerium element.

<Measurement of Absorbance and Light Transmittance>

A suitable amount of cerium hydroxide slurry storage solution was taken and diluted with water so that a content of the abrasive grain was adjusted to 0.0065 mass % (65 ppm), to obtain a measuring sample (aqueous dispersion). Approximately 4 mL of this measuring sample was placed in a 1 cm-square cell, and the cell was set in a spectrophotometer (apparatus name: U3310) by Hitachi, Ltd. Spectrophotometry was performed in a wavelength range of 200 to 600 nm to measure the absorbance for light with a wavelength of 290 nm and absorbance for light with a wavelength of 450 to 600 nm. The absorbance for light with a wavelength of 290 nm was 1.192, and the absorbance for light with a wavelength of 450 to 600 nm was less than 0.010.

Approximately 4 mL of the cerium hydroxide slurry storage solution (particle content: 1.0 mass %) was placed in a 1 cm-square cell, and the cell was set in a spectrophotometer (apparatus name: U3310) by Hitachi, Ltd. Spectrophotometry was performed in a wavelength range of 200 to 600 nm to measure the absorbance for light with a wavelength of 400 nm and the light transmittance for light with a wavelength of 500 nm. The absorbance for light with a wavelength of 400 nm was 2.25, and the light transmittance for light with a wavelength of 500 nm was 92%/cm.

<Preparation of Polishing Liquid for CMP>

Example 1

100 g of an additive storage solution containing 0.5 mass % of a branched polymer [trade name: DISPERBYK-190 by BYK-Chemie GmbH, non-volatile content: 40 mass %, acid value: 10 mgKOH/g, weight-average molecular weight: 23000], 0.038 mass % of 2-methylimidazole [pH adjuster]

and 99.462 mass % of water, 850 g of water, and 50 g of the cerium hydroxide slurry storage solution were mixed to thereby prepare a polishing liquid for CMP with a pH of 6.0 containing 0.05 mass % of an abrasive grain containing cerium hydroxide and 0.05 mass % of the branched polymer.

Example 2

100 g of an additive storage solution containing 0.5 mass % of a branched polymer [trade name: DISPERBYK-190 by BYK-Chemie GmbH, non-volatile content: 40 mass %, acid value: 10 mgKOH/g, weight-average molecular weight: 23000], 5.0 mass % of polyoxyethylene styrenated phenyl ether [trade name: Emulgen A-500 by Kao Corporation, weight-average molecular weight: 3500], 0.082 mass % of 2-methylimidazole [pH adjuster], 0.05 mass % of acetic acid [pH stabilizer] and 94.368 mass % of water, 850 g of water, and 50 g of the cerium hydroxide slurry storage solution were mixed to thereby prepare a polishing liquid for CMP with a pH of 5.9 containing 0.05 mass % of an abrasive grain containing cerium hydroxide, 0.05 mass % of the branched polymer and 0.5 mass % of the polyoxyethylene styrenated phenyl ether.

Example 3

100 g of an additive storage solution containing 0.25 mass % of a branched polymer [trade name: DISPERBYK-190 by BYK-Chemie GmbH, non-volatile content: 40 mass %, acid value: 10 mgKOH/g, weight-average molecular weight: 23000], 5.0 mass % of polyoxyethylene styrenated phenyl ether [trade name: Emulgen A-500 by Kao Corporation, weight-average molecular weight: 3500], 0.03 mass % of a diallyldimethylammonium chloride/acrylamide copolymer [cationic polymer, trade name: PAS-J-81 by Nittobo Medical Co., Ltd., weight-average molecular weight: 200000], 0.082 mass % of 2-methylimidazole [pH adjuster], 0.05 mass % of acetic acid [pH stabilizer] and 94.588 mass % of water, 850 g of water, and 50 g of the cerium hydroxide slurry storage solution were mixed to thereby prepare a polishing liquid for CMP with a pH of 6.1 containing 0.05 mass % of an abrasive grain containing cerium hydroxide, 0.025 mass % of the branched polymer, 0.5 mass % of the polyoxyethylene styrenated phenyl ether and 0.003 mass % of the diallyldimethylammonium chloride/acrylamide copolymer.

Example 4

The same manner as Example 3 was made except for the contents of the cationic polymer and the pH adjuster, to thereby prepare a polishing liquid for CMP with a pH of 6.2 containing 0.05 mass % of an abrasive grain containing cerium hydroxide, 0.025 mass % of the branched polymer, 0.5 mass % of the polyoxyethylene styrenated phenyl ether and 0.002 mass % of the diallyldimethylammonium chloride/acrylamide copolymer.

Example 5

The same manner as Example 3 was made except for the contents of the cationic polymer and the pH adjuster, to thereby prepare a polishing liquid for CMP with a pH of 6.1 containing 0.05 mass % of an abrasive grain containing cerium hydroxide, 0.025 mass % of the branched polymer, 0.5 mass % of the polyoxyethylene styrenated phenyl ether and 0.001 mass % of the diallyldimethylammonium chloride/acrylamide copolymer.

Example 6

The same manner as Example 4 was made except for the contents of the branched polymer [trade name: DISPERBYK-190 by BYK-Chemie GmbH] and the pH adjuster, to thereby prepare a polishing liquid for CMP with a pH of 6.1 containing 0.05 mass % of an abrasive grain containing cerium hydroxide, 0.05 mass % of the branched polymer, 0.5 mass % of the polyoxyethylene styrenated phenyl ether and 0.002 mass % of the diallyldimethylammonium chloride/acrylamide copolymer.

Example 7

The same manner as Example 6 was made except for the content of the cationic polymer, to thereby prepare a polishing liquid for CMP with a pH of 6.1 containing 0.05 mass % of an abrasive grain containing cerium hydroxide, 0.05 mass % of the branched polymer, 0.5 mass % of the polyoxyethylene styrenated phenyl ether and 0.001 mass % of the diallyldimethylammonium chloride/acrylamide copolymer.

Example 8

The same manner as Example 7 was made except for the content of the pH adjuster, to thereby prepare a polishing liquid for CMP with a pH of 5.6 containing 0.05 mass % of an abrasive grain containing cerium hydroxide, 0.05 mass % of the branched polymer, 0.5 mass % of the polyoxyethylene styrenated phenyl ether and 0.001 mass % of the diallyldimethylammonium chloride/acrylamide copolymer.

Example 9

The same manner as Example 7 was made except for the content of the pH adjuster, to thereby prepare a polishing liquid for CMP with a pH of 6.6 containing 0.05 mass % of an abrasive grain containing cerium hydroxide, 0.05 mass % of the branched polymer, 0.5 mass % of the polyoxyethylene styrenated phenyl ether and 0.001 mass % of the diallyldimethylammonium chloride/acrylamide copolymer.

Example 10

The same manner as Example 7 was made except for the type and the content of a branched polymer [trade name: TEGO Dispers 755W by Evonik Industries, non-volatile content: 40 mass %, acid value: 15 mgKOH/g, weight-average molecular weight: 18000], to thereby prepare a polishing liquid for CMP with a pH of 6.1 containing 0.05 mass % of an abrasive grain containing cerium hydroxide, 0.03 mass % of the branched polymer, 0.5 mass % of the polyoxyethylene styrenated phenyl ether and 0.001 mass % of the diallyldimethylammonium chloride/acrylamide copolymer.

Example 11

The same manner as Example 3 was made except for the type of a branched polymer [trade name: TEGO Dispers 765W by Evonik Industries, non-volatile content: 40 mass %, acid value: 10 mgKOH/g], and the contents of the branched polymer, the pH adjuster and the pH stabilizer, to thereby prepare a polishing liquid for CMP with a pH of 6.6 containing 0.05 mass % of an abrasive grain containing cerium hydroxide, 0.06 mass % of the branched polymer, 0.5 mass % of the polyoxyethylene styrenated phenyl ether and 0.003 mass % of the diallyldimethylammonium chloride/acrylamide copolymer.

Example 12

The same manner as Example 7 was made except for the type of a branched polymer [trade name: DISPERBYK-2015 by BYK-Chemie GmbH, non-volatile content: 40 mass %, acid value: 10 mgKOH/g], to thereby prepare a polishing liquid for CMP with a pH of 6.0 containing 0.05 mass % of an abrasive grain containing cerium hydroxide, 0.05 mass % of the branched polymer, 0.5 mass % of the polyoxyethylene styrenated phenyl ether and 0.001 mass % of the diallyldimethylammonium chloride/acrylamide copolymer.

Example 13

The same manner as Example 11 was made except for the type of a polyoxyalkylene compound [trade name: BAP4-30H by Nippon Nyukazai Co., Ltd., EO (ethylene oxide) adduct of bisphenol A (EO=30)], and the contents of the branched polymer, the cationic polymer, the pH adjuster and the pH stabilizer, to thereby prepare a polishing liquid for CMP with a pH of 5.7 containing 0.05 mass % of an abrasive grain containing cerium hydroxide, 0.05 mass % of the branched polymer, 0.5 mass % of the polyoxyalkylene compound and 0.002 mass % of the diallyldimethylammonium chloride/acrylamide copolymer.

Example 14

The same manner as Example 13 was made except for the type of a branched polymer [trade name: Floren GW-1500 by Kyoeisha Chemical Co., Ltd., non-volatile content: 100 mass %, acid value: 55 mgKOH/g], and the contents of the branched polymer and the pH adjuster, to thereby prepare a polishing liquid for CMP with a pH of 6.1 containing 0.05 mass % of an abrasive grain containing cerium hydroxide, 0.03 mass % of the branched polymer, 0.5 mass % of the polyoxyalkylene compound and 0.002 mass % of the diallyldimethylammonium chloride/acrylamide copolymer.

Comparative Example 1

The same manner as Example 1 was made except that no branched polymer was used and acetic acid was used, and the content of the pH adjuster was different, to thereby prepare a polishing liquid for CMP with a pH of 6.0 containing 0.05 mass % of an abrasive grain containing cerium hydroxide.

Comparative Example 2

The same manner as Example 2 was made except that no branched polymer was used and the content of the pH adjuster was different, to thereby prepare a polishing liquid for CMP with a pH of 6.0 containing 0.05 mass % of an abrasive grain containing cerium hydroxide and 0.5 mass % of the polyoxyethylene styrenated phenyl ether.

Comparative Example 3

The same manner as Example 3 was made except that no branched polymer was used and the content of the pH adjuster was different, to thereby prepare a polishing liquid for CMP with a pH of 6.1 containing 0.05 mass % of an abrasive grain containing cerium hydroxide, 0.5 mass % of the polyoxyethylene styrenated phenyl ether and 0.003 mass % of the diallyldimethylammonium chloride/acrylamide copolymer.

<Evaluation of Polishing Liquid Properties>
(pH Measurement)
The pH of the polishing liquid for CMP was evaluated under the following conditions.
Measuring temperature: 25±5° C.
Measuring apparatus: Model PHL-40 by DKK Corp.
Measuring method: After 2-point calibration using a standard buffer solution (phthalate pH buffer solution: pH: 4.01 (25° C.); neutral phosphate pH buffer solution: pH: 6.86 (25° C.)), the electrode was placed in the polishing liquid for CMP, and then the pH was measured with the measuring apparatus described above after at least 2 minutes passed for stabilization.

(Particle Diameter Measurement of Abrasive Grain)
The mean particle diameter of the abrasive grain (abrasive grain containing cerium hydroxide) in the polishing liquid for CMP was evaluated under the following conditions.
Measuring temperature: 25±5° C.
Measuring apparatus: trade name: N5 by Beckman Coulter, Inc.
Measuring method: Approximately 1 mL of the polishing liquid for CMP was placed in a 1 cm-square measurement cell and the cell was set in the N5. Measurement was performed with the refractive index adjusted to 1.333 and the viscosity adjusted to 0.887 mPa·s as the measuring sample information in the N5 software, and the value indicated as Unimodal Size Mean was read off.

<CMP Evaluation>
The polishing liquid for CMP in each of Examples 1 to 14 and Comparative Examples 1 to 3 was used for polishing of each of a substrate having a silicon nitride film and a substrate having a silicon oxide film under the following polishing conditions.

(CMP Polishing Conditions)
Polishing apparatus: Reflexion (Applied Materials, Inc.)
Flow rate of polishing liquid for CMP: 200 mL/min
Substrate to be polished: Non-pattern wafer described below
Abrasive pad: Foamed polyurethane resin with closed cells (Model No. IC1010 A6 by Rohm And Haas Electronic Materials Cmp Inc.)
Polishing pressure: 16.5 kPa (2.4 psi)
Relative speed between substrate and polishing platen: 85 m/min
Polishing time: 1 minute
Cleaning: After CMP treatment, cleaning was performed by water with ultrasonic irradiation, and then drying was performed with a spin dryer.

(Non-Pattern Wafer)
As blanket wafers without formation of a pattern, a substrate having a 1 μm-thick silicon oxide film formed on a silicon substrate by plasma CVD method, and a substrate having a 0.2 μm-thick silicon nitride film formed on a silicon substrate by CVD method were used.

(Evaluation of Polished Products)
[Blanket Wafer Polishing Rate]
The polishing rates for films to be polished (silicon nitride film and silicon oxide film) of the polished substrates that had been polished and cleaned under the conditions described above (silicon nitride film polishing rate: SiNRR, and silicon oxide film polishing rate: $SiO_2RR$) were determined by the following formula. The difference in film thickness of the film to be polished before and after polishing was determined using a light-interference film thickness meter (trade name: F80 by Filmetrics Japan, Inc.).

(Polishing rate: RR)=(Film thickness difference of film to be polished before and after polishing (nm))/polishing time (min))

[Evaluation of Polishing Scratches]

A polished substrate (substrate having a silicon oxide film) that had been polished and cleaned under the conditions described above was dipped for 15 seconds in an aqueous solution of 0.5 mass % hydrogen fluoride and then washed with water for 60 seconds. Next, the surface of the polished film was cleaned for 1 minute using a PVA brush while supplying water, and then dried. Complus by Applied Materials, Inc. was used to detect defects of 0.2 μm or greater on the surface of the polished film. Also, upon observation of the surface of the polished film using the defect detection coordinates obtained by the Complus, and using an SEM Vision by Applied Materials, Inc., the number of polishing scratches of 0.2 μm or greater on the surface of the polished film was about 0 to 3 (per wafer) in all of Examples 1 to 14 and Comparative Examples 1 to 3, and this indicates that generation of polishing scratches was adequately inhibited.

The respective measurement results obtained in Examples 1 to 14 and Comparative Examples 1 to 3 are shown in Table 1 and Table 2.

TABLE 1

| Component | Item | Comparative Example 1 | Example 1 | Comparative Example 2 | Example 2 | Comparative Example 3 | Example 3 | Example 4 | Example 5 | Example 6 |
|---|---|---|---|---|---|---|---|---|---|---|
| Abrasive grain | Type | Cerium hydroxide | | | | | | | | |
| | Content (mass %) | 0.05 | | | | | | | | |
| Branched polymer | Type | — | DISPERBYK-190 | — | DISPERBYK-190 | — | DISPERBYK-190 | | | |
| | Weight-average molecular weight | — | 23000 | — | 23000 | — | 23000 | | | |
| | Content (mass %) | — | 0.05 | — | 0.05 | — | 0.025 | | | 0.05 |
| Optional additive 1 (polyoxyalkylene compound) | Type | — | — | Polyoxyethylene styrenated phenyl ether | | | | | | |
| | Weight-average molecular weight | — | — | 3500 | | | | | | |
| | Content (mass %) | — | — | 0.5 | | | | | | |
| Optional additive 2 (cationic polymer) | Type | — | — | Diallyldimethylammonium chloride/acrylamide copolymer | | | | | | |
| | Weight-average molecular weight | — | — | 200000 | | | | | | |
| | Content (mass %) | — | — | 0.003 | | 0.002 | 0.001 | 0.002 | | |
| pH adjuster | Type | 2-Methylimidazole | | | | | | | | |
| | Content (mass %) | 0.008 | 0.0038 | 0.008 | 0.0082 | 0.008 | 0.0082 | 0.0086 | | 0.0085 |
| pH stabilizer | Type | Acetic acid | — | Acetic acid | | | | | | |
| | Content (mass %) | 0.005 | — | 0.005 | | | | | | |
| Polishing liquid properties | pH | 6.0 | 6.0 | 6.0 | 5.9 | 6.1 | 6.1 | 6.2 | 6.1 | 6.1 |
| | Particle diameter of abrasive grain (nm) | 22 | 25 | 22 | 23 | 20 | 23 | 23 | 21 | 23 |
| Polishing rate (nm/min) | SiO$_2$ RR | 140 | 78 | 103 | 108 | 228 | 258 | 222 | 179 | 151 |
| | SiN RR | 35 | 7 | 34 | 1 | 29 | 6 | 9 | 10 | 1 |
| Polishing rate ratio | SiO$_2$ RR/SiN RR | 4 | 11 | 3 | 108 | 8 | 43 | 25 | 18 | 151 |

TABLE 2

| Component | Item | Example 7 | Example 8 | Example 9 | Example 10 | Example 11 | Example 12 | Example 13 | Example 14 |
|---|---|---|---|---|---|---|---|---|---|
| Abrasive grain | Type | Cerium hydroxide | | | | | | | |
| | Content (mass %) | 0.05 | | | | | | | |
| Branched polymer | Type | DISPERBYK-190 | | | TEGO Dispers 755W | TEGO Dispers 765W | DISPERBYK-2015 | TEGO Dispers 765W | Floren GW-1500 |
| | Weight-average molecular weight | 23000 | | 18000 | — | — | — | — | |
| | Content (mass %) | 0.05 | 0.03 | 0.06 | 0.05 | 0.05 | 0.03 | | |
| Optional additive 1 (polyoxyalkylene compound) | Type | Polyoxyethylene styrenated phenyl ether | | | | | | EO adduct of bisphenol A (EO = 30) | |
| | Weight-average molecular weight | 3500 | | | | | | 1500 | |
| | Content (mass %) | 0.5 | | | | | | | |
| Optional additive 2 (cationic polymer) | Type | Diallyldimethylammonium chloride/acrylamide copolymer | | | | | | | |
| | Weight-average molecular weight | 200000 | | | | | | | |
| | Content (mass %) | 0.001 | 0.003 | 0.001 | | | | 0.002 | |

TABLE 2-continued

| Component | Item | Example | | | | | | | |
|---|---|---|---|---|---|---|---|---|---|
| | | 7 | 8 | 9 | 10 | 11 | 12 | 13 | 14 |
| pH adjuster | Type | 2-Methylimidazole | | | | | | | |
| | Content (mass %) | 0.0085 | 0.006 | 0.011 | 0.0085 | 0.021 | 0.0085 | 0.006 | 0.0087 |
| pH stabilizer | Type | | | | | Acetic acid | | | |
| | Content (mass %) | | 0.005 | | | 0.014 | | 0.005 | |
| Polishing liquid properties | pH | 6.1 | 5.6 | 6.6 | 6.1 | 6.6 | 6.0 | 5.7 | 6.1 |
| | Particle diameter of abrasive grain (nm) | 22 | 21 | 25 | 22 | 20 | 23 | 20 | 25 |
| Polishing rate (nm/min) | $SiO_2$ RR | 131 | 126 | 134 | 138 | 177 | 121 | 178 | 187 |
| | SiN RR | 1 | 1 | 1 | 1 | 3 | 1 | 1 | 1 |
| Polishing rate ratio | $SiO_2$ RR/SiN RR | 131 | 126 | 134 | 138 | 59 | 121 | 178 | 187 |

The results shown in Table 1 and Table 2 will now be explained in detail.

The polishing rate for the silicon nitride film in Example 1 was 7 nm/min, and the obtained result indicated that polishing of silicon nitride was further inhibited as compared with Comparative Example 1. In addition, the polishing rate for the silicon oxide film was 78 nm/min. The polishing selectivity for the silicon oxide film with respect to the silicon nitride film was 11, and the obtained result was higher than that in Comparative Example 1.

The polishing rate for the silicon nitride film in Example 2 was 1 nm/min, and the obtained result indicated that polishing of silicon nitride was further inhibited as compared with Comparative Example 2. In addition, the polishing rate for the silicon oxide film was 108 nm/min. The polishing selectivity for the silicon oxide film with respect to the silicon nitride film was 108, and the obtained result was higher than that in Comparative Example 2.

The polishing rate for the silicon nitride film in Example 3 was 6 nm/min, and the obtained result indicated that polishing of silicon nitride was further inhibited as compared with Comparative Example 3. In addition, the polishing rate for the silicon oxide film was 258 nm/min. The polishing selectivity for the silicon oxide film with respect to the silicon nitride film was 43, and the obtained result was higher than that in Comparative Example 3.

The polishing rate for the silicon nitride film in Example 4 was 9 nm/min, and the obtained result indicated that polishing of silicon nitride was further inhibited as compared with Comparative Examples 1 to 3. In addition, the polishing rate for the silicon oxide film was 222 nm/min. The polishing selectivity for the silicon oxide film with respect to the silicon nitride film was 25, and the obtained result was higher than that in Comparative Example 3.

The polishing rate for the silicon nitride film in Example 5 was 10 nm/min, and the obtained result indicated that polishing of silicon nitride was further inhibited as compared with Comparative Examples 1 to 3. In addition, the polishing rate for the silicon oxide film was 179 nm/min. The polishing selectivity for the silicon oxide film with respect to the silicon nitride film was 18, and the obtained result was higher than that in Comparative Example 3.

The polishing rate for the silicon nitride film in Example 6 was 1 nm/min, and the obtained result indicated that polishing of silicon nitride was further inhibited as compared with Comparative Examples 1 to 3. In addition, the polishing rate for the silicon oxide film was 151 nm/min. The polishing selectivity for the silicon oxide film with respect to the silicon nitride film was 151, and the obtained result was higher than that in Comparative Example 3.

The polishing rate for the silicon nitride film in Example 7 was 1 nm/min, and the obtained result indicated that polishing of silicon nitride was further inhibited as compared with Comparative Examples 1 to 3. In addition, the polishing rate for the silicon oxide film was 131 nm/min. The polishing selectivity for the silicon oxide film with respect to the silicon nitride film was 131, and the obtained result was higher than that in Comparative Example 3.

The polishing rate for the silicon nitride film in Example 8 was 1 nm/min, and the obtained result indicated that polishing of silicon nitride was further inhibited as compared with Comparative Examples 1 to 3. In addition, the polishing rate for the silicon oxide film was 126 nm/min. The polishing selectivity for the silicon oxide film with respect to the silicon nitride film was 126, and the obtained result was higher than that in Comparative Example 3.

The polishing rate for the silicon nitride film in Example 9 was 1 nm/min, and the obtained result indicated that polishing of silicon nitride was further inhibited as compared with Comparative Examples 1 to 3. In addition, the polishing rate for the silicon oxide film was 134 nm/min. The polishing selectivity for the silicon oxide film with respect to the silicon nitride film was 134, and the obtained result was higher than that in Comparative Example 3.

The polishing rate for the silicon nitride film in Example 10 was 1 nm/min, and the obtained result indicated that polishing of silicon nitride was further inhibited as compared with Comparative Examples 1 to 3. In addition, the polishing rate for the silicon oxide film was 138 nm/min. The polishing selectivity for the silicon oxide film with respect to the silicon nitride film was 138, and the obtained result was higher than that in Comparative Example 3.

The polishing rate for the silicon nitride film in Example 11 was 3 nm/min, and the obtained result indicated that polishing of silicon nitride was further inhibited as compared with Comparative Examples 1 to 3. In addition, the polishing rate for the silicon oxide film was 177 nm/min. The polishing selectivity for the silicon oxide film with respect to the silicon nitride film was 59, and the obtained result was higher than that in Comparative Example 3.

The polishing rate for the silicon nitride film in Example 12 was 1 nm/min, and the obtained result indicated that polishing of silicon nitride was further inhibited as compared with Comparative Examples 1 to 3. In addition, the polishing rate for the silicon oxide film was 121 nm/min. The polishing selectivity for the silicon oxide film with respect to the silicon nitride film was 121, and the obtained result was higher than that in Comparative Example 3.

The polishing rate for the silicon nitride film in Example 13 was 1 nm/min, and the obtained result indicated that polishing of silicon nitride was further inhibited as compared with Comparative Examples 1 to 3. In addition, the polishing rate for the silicon oxide film was 178 nm/min, and the polishing selectivity for the silicon oxide film with respect to the silicon nitride film was 178.

The polishing rate for the silicon nitride film in Example 14 was 1 nm/min, and the obtained result indicated that polishing of silicon nitride was further inhibited as compared with Comparative Examples 1 to 3. In addition, the polishing rate for the silicon oxide film was 187 nm/min, and the polishing selectivity for the silicon oxide film with respect to the silicon nitride film was 187.

In Comparative Example 1, the polishing rate for the silicon nitride film was 35 nm/min and the polishing rate for the silicon oxide film was 140 nm/min, and the polishing selectivity for the silicon oxide film with respect to the silicon nitride film was 4.

In Comparative Example 2, the polishing rate for the silicon nitride film was 34 nm/min and the polishing rate for the silicon oxide film was 103 nm/min, and the polishing selectivity for the silicon oxide film with respect to the silicon nitride film was 3.

In Comparative Example 3, the polishing rate for the silicon nitride film was 29 nm/min and the polishing rate for the silicon oxide film was 228 nm/min, and the polishing selectivity for the silicon oxide film with respect to the silicon nitride film was 8.

INDUSTRIAL APPLICABILITY

According to the invention, it is possible to polish an insulating material at a high polishing rate and also adequately inhibit the polishing rate for a stopper material. Such invention allows the polishing selectivity for insulating material with respect to stopper material to be improved. Furthermore, according to the invention, in CMP techniques for flattening of STI insulating materials, pre-metal insulating materials, interlayer insulating materials and the like, it is possible to improve the polishing selectivity for insulating material with respect to stopper material and polish the insulating materials with few polishing scratches.

The invention claimed is:

1. A polishing liquid comprising:
a liquid medium;
abrasive grains comprising a hydroxide of a tetravalent metal element; and
a polymer, wherein
the polymer includes a first molecular chain having a functional group directly bonded thereto, and a second molecular chain branched from the first molecular chain,
the functional group comprises at least one selected from the group consisting of a carboxyl group, a carboxylic acid salt group, a hydroxyl group, a sulfo group and a sulfonic acid salt group,
the first molecular chain comprises styrene as a monomer unit,
the second molecular chain comprises at least one selected from the group consisting of a polyether chain, a polyvinyl alcohol chain and a polyvinylpyrrolidone chain, and
a content of the polymer is 0.001 mass % or greater and 0.5 mass % or less based on a total mass of the polishing liquid, and
pH of the polishing liquid is 2.0-8.0.

2. The polishing liquid according to claim 1, wherein the functional group comprises at least one selected from the group consisting of a carboxyl group, a carboxylic acid salt group, a sulfa group and a sulfonic acid salt group.

3. The polishing liquid according to claim 1, wherein the functional group comprises at least one selected from the group consisting of a carboxyl group and a carboxylic acid salt group.

4. The polishing liquid according to claim 1, wherein the first molecular chain further comprises a structural unit derived from maleic acid.

5. The polishing liquid according to claim 1, wherein the second molecular chain comprises at least one selected from the group consisting of a hydrophilic molecular chain and a hydrophobic molecular chain.

6. The polishing liquid according to claim 1, wherein the second molecular chain comprises a polyoxyalkylene chain.

7. The polishing liquid according to claim 1, wherein the abrasive grains further comprise at least one selected from the group consisting of ceria, silica, alumina, and zirconia.

8. The polishing liquid according to claim 1, wherein the hydroxide of a tetravalent metal element comprises at least one selected from the group consisting of a hydroxide of a rare earth metal element and a hydroxide or zirconium.

9. A polishing liquid set comprising:
constituent components of the polishing liquid according to claim 1, separately stored as a first liquid and a second liquid, wherein
the first liquid comprises the abrasive grains and a liquid medium, and
the second liquid comprises the polymer and a liquid medium.

10. A polishing method for a base substrate, comprising:
a step of polishing a surface to be polished of a base substrate using the polishing liquid according to claim 1.

11. The polishing method according to claim 10, wherein the surface to be polished contains silicon oxide.

12. A polishing method for a base substrate having an insulating material and silicon nitride,
the polishing method comprising a step of selectively polishing the insulating material with respect to the silicon nitride using the polishing liquid according to claim 1.

13. A polishing method for a base substrate having an insulating material and polysilicon,
the polishing method comprising a step of selectively polishing the insulating material with respect to the polysilicon using the polishing liquid according to claim 1.

14. A polishing liquid comprising:
a liquid medium;
abrasive grains comprising a hydroxide of a tetravalent metal element; and
a polymer, wherein
the polymer includes a first molecular chain having a functional group directly bonded thereto, and a second molecular chain branched from the first molecular chain,
the functional group comprises at least one selected from the group consisting of a carboxyl group, a carboxylic acid salt group, a hydroxyl group, a sulfa group and a sulfonic acid salt group,
the first molecular chain comprises styrene as a monomer unit,
the second molecular chain comprises at least one selected from the group consisting of a hydrophilic molecular chain and a hydrophobic molecular chain, and a content of the polymer is 0.001 mass % or greater and 0.5 mass % or less based on a total mass of the polishing liquid, and pH of the polishing liquid is 2.0-8.0.

15. The polishing liquid according to claim 14, wherein the functional group comprises at least one selected from the group consisting of a carboxyl group, a carboxylic acid salt group, a sulfa group and a sulfonic acid salt group.

16. The polishing liquid according to claim 14, wherein the functional group comprises at least one selected from the group consisting of a carboxyl group and a carboxylic acid salt group.

17. The polishing liquid according to claim 14, wherein the first molecular chain further comprises a structural unit derived from maleic acid.

18. The polishing liquid according to claim 14, wherein the second molecular chain comprises a polyoxyalkylene chain.

19. A polishing method for a base substrate, comprising:
a step of polishing a surface to be polished of a base substrate using the polishing liquid according to claim 14.

20. The polishing liquid according to claim 14, wherein the abrasive grains further comprise at least one selected from the group consisting of cerin, silica, alumina, and zirconia.

21. A polishing liquid set comprising:
constituent components of the polishing liquid according to claim 14, separately stored as a first liquid and a second liquid, wherein
the first liquid comprises the abrasive grains and a liquid medium, and
the second liquid comprises the polymer and a liquid medium.

22. The polishing liquid according to claim 14, wherein the hydroxide of a tetravalent metal element comprises at least one selected from the group consisting of a hydroxide of a rare earth metal element and a hydroxide or zirconium.

* * * * *